United States Patent
Oda et al.

(10) Patent No.: US 12,344,694 B2
(45) Date of Patent: Jul. 1, 2025

(54) PHOTOCURABLE RESIN COMPOSITION FOR IMPRINTING, METHOD FOR PRODUCING PHOTOCURABLE RESIN COMPOSITION FOR IMPRINTING, AND METHOD FOR PRODUCING PATTERN FORMED BODY

(71) Applicant: DAI NIPPON PRINTING CO., LTD., Tokyo-to (JP)

(72) Inventors: Hirokazu Oda, Tokyo-to (JP); Shintaro Nasu, Tokyo-to (JP); Masakazu Kaneko, Tokyo-to (JP)

(73) Assignee: DAI NIPPON PRINTING CO., LTD., Tokyo (JP)

(*) Notice: Subject to any disclaimer, the term of this patent is extended or adjusted under 35 U.S.C. 154(b) by 464 days.

(21) Appl. No.: 17/599,514

(22) PCT Filed: Mar. 24, 2020

(86) PCT No.: PCT/JP2020/013059
§ 371 (c)(1),
(2) Date: Sep. 28, 2021

(87) PCT Pub. No.: WO2020/203472
PCT Pub. Date: Oct. 8, 2020

(65) Prior Publication Data
US 2022/0169774 A1    Jun. 2, 2022

(30) Foreign Application Priority Data

Mar. 29, 2019  (JP) ................................. 2019-069168
Dec. 20, 2019  (JP) ................................. 2019-230297

(51) Int. Cl.
*C08F 299/08*     (2006.01)
*B29C 59/00*     (2006.01)
(Continued)

(52) U.S. Cl.
CPC .......... *C08F 299/08* (2013.01); *B29C 59/005* (2013.01); *C08F 230/08* (2013.01); *B29C 59/02* (2013.01); *B29K 2083/00* (2013.01)

(58) Field of Classification Search
None
See application file for complete search history.

(56) References Cited

U.S. PATENT DOCUMENTS 8,293,354 B2 * 10/2012 Fu .......................... C08G 77/24
                                                           428/167
2004/0009673 A1  1/2004 Sreenivasan et al.
(Continued)

FOREIGN PATENT DOCUMENTS

CN    103059306 A    4/2013
JP    2005-533393 A    11/2005
(Continued)

OTHER PUBLICATIONS

Jun. 30, 2020 International Search Report issued in International Patent Application No. PCT/JP2020/013059.

*Primary Examiner* — Sanza L. McClendon
(74) *Attorney, Agent, or Firm* — Oliff PLC

(57) ABSTRACT

A photocurable resin composition for imprinting including a polymerizable compound, and a photopolymerization initiator, wherein the polymerizable compound includes a siloxane bond in a molecule, and includes at least one polymerizable functional group, and a ratio of oxygen atoms bonded to a single silicon atom, among oxygen atoms bonded to a silicon atom included in the polymerizable compound, is 10 mol % or less.

11 Claims, 2 Drawing Sheets

(51) Int. Cl.
  *C08F 230/08*   (2006.01)
  *B29C 59/02*   (2006.01)
  *B29K 83/00*   (2006.01)

(56)         References Cited

U.S. PATENT DOCUMENTS

2009/0256287 A1  10/2009  Fu et al.
2015/0378258 A1  12/2015  Araki et al.
2017/0306062 A1  10/2017  Ibe et al.
2019/0041745 A1   2/2019  Ibe et al.

FOREIGN PATENT DOCUMENTS

| JP | 2009-206197 A | 9/2009 | |
|---|---|---|---|
| JP | 2011-035173 A | 2/2011 | |
| JP | 6090547 B2 | 3/2017 | |
| TW | 200407682 A | 5/2004 | |
| TW | 201437764 A | 10/2014 | |
| WO | WO-03035762 A1 * | 5/2003 | ............... C08K 3/36 |
| WO | 2014/126013 A1 | 8/2014 | |
| WO | 2017/195586 A1 | 11/2017 | |

* cited by examiner

PHOTOCURABLE RESIN COMPOSITION FOR IMPRINTING, METHOD FOR PRODUCING PHOTOCURABLE RESIN COMPOSITION FOR IMPRINTING, AND METHOD FOR PRODUCING PATTERN FORMED BODY

TECHNICAL FIELD

The present disclosure relates to a photocurable resin composition for imprinting, a method for producing a photocurable resin composition for imprinting, and a method for producing a pattern formed body.

BACKGROUND ART

Nanoimprint lithography is a method for transferring a pattern to a curable resin layer by bringing an imprint mold including a prepared desired pattern on a surface thereof, into close contact with a curable resin layer of a transfer receptor and applying external stimulus such as heat and light. According to the nanoimprint lithography, a pattern may be formed by a simple method, and recently, it has been shown to be capable of transferring hyperfine patterns of tens of nm to several nm. Therefore, nanoimprint lithography is expected as a candidate for next generation lithography technology.

The photocurable resin used in the above described nanoimprint lithography, particularly in the optical nanoimprint method, is usually an acrylic organic resin. When the formed fine pattern is used as a resist, the selectivity of the etching rate depending to the type of gas of dry etching is important. When functioning as a resist, it is needed to be highly resistant to a gas used, and easily removed when it is removed. Examples of the gas commonly used as an etching gas may include fluorine-based gases and oxygen. Generally, in the case of an organic resin, there is no large difference in the etching rate between the fluorine-based gas and the oxygen gas.

Therefore, in order to obtain selectivity between the fluorine-based gas and the oxygen gas, it is conceivable to use a silicon compound including a siloxane bond and including a polysiloxane structure. Since a resin including a polysiloxane structure exhibits a characteristic property that is not exhibited by an organic material, a photocurable composition including a polysiloxane structure has the above described required characteristics and is preferably used in an optical nanoimprint method.

Meanwhile, as a mold used in the optical imprint method, a quartz mold is typically used. The quartz mold is a material suitable for the optical imprint method since it transmits ultraviolet rays well, has high hardness, and has high surface smoothness. However, quartz mold is more expensive than other mold materials since quartz is difficult to process. Therefore, the mold is repeatedly used. Thus, since the existence of residue on the mold affects pattern formation, a complete cleaning is required. Especially, in the optical nanoimprint method wherein the pattern is ultra-fine, the mold pattern is easily blocked by the resist cured product so that the cleaning is important.

However, when a resist material including silicon atoms as described above is used for such a quartz based mold, a reaction occurs between the resist material and the mold surface, and the resist material is firmly adhered to the mold, which may make cleaning difficult. In this case, since both the imprint mold and the resist material include silicon atoms, there has been a problem that, depending on the type of the chemical solution, the imprint mold itself may also be damaged during cleaning.

In order to solve the above problem, for example, a resin including a silicon atom including a specific structure is used in Patent Document 1. Also, in Patent Document 2, a method for preventing a contamination of a mold by adding an additive, is proposed.

CITATION LIST

Patent Documents

Patent Document 1: Japanese Patent No. 6090547
Patent Document 2: International Publication WO2017/195586

SUMMARY OF DISCLOSURE

Technical Problem

However, in the method described in Patent Document 1, there has been a problem that the range of the material selection is narrowed. Also, in the method disclosed in Patent Document 2, there is a possibility that a problem such as bleeding of the additive occurs, and there is a fear that a transcript is contaminated.

Further, since a resist material is usually used by being applied to a substrate, for example, it is preferable that a condition wherein the viscosity is low, may be maintained for along period of time. However, many resist materials including a silicon atom have low stability over time, and there has been a problem that a curing reaction proceeds during storage so that the viscosity is increased. If the viscosity is increased during storage in this manner, there are problems that uniform application is difficult, and accurate transfer is difficult.

The present invention has been made in view of the above circumstances, and an object of the present invention is to provide a photocurable resin composition for imprinting having a high antifouling effect to an imprint mold and also excellent in stability over time.

Solution to Problem

In order to achieve the object, the present disclosure provides a photocurable resin composition for imprinting comprising a polymerizable compound, and a photopolymerization initiator, wherein the polymerizable compound includes a siloxane bond in a molecule, and includes at least one polymerizable functional group, and a ratio of oxygen atoms bonded to a single silicon atom, among oxygen atoms bonded to a silicon atom included in the polymerizable compound, is 10 mol % or less.

In photocurable resin composition for imprinting in the present disclosure, the ratio of oxygen atoms bonded to a single silicon atom, that is, the ratio of highly reactive functional group, having a high reactivity such as —OH or —OR (R represents an alkyl group with 1 to 4 carbons), bonded to a silicon atom is low. Therefore, progress of a curing reaction during storage may be suppressed, and a photocurable resin composition for imprinting having excellent stability over time may be obtained. Also, for the same reason, since the reaction with the mold surface may be suppressed, it is possible to provide a photocurable resin composition for imprinting having a high antifouling effect to the mold.

In the disclosure, the polymerizable functional group is preferably at least one selected from a group consisting of an acryloyl group, a methacryloyl group, an epoxy group, and an oxetane group. The reason therefor is to impart good photocurability.

In the disclosure, the photocurable resin composition for imprinting in the present disclosure preferably further comprises a fluorine-based or a silicone-based surfactant, and the content of the surfactant is preferably 10 mass % or less, with respect to a total solid content of the photocurable resin composition for imprinting. The reason therefor is to minimize the problem of bleeding of the surfactant, as well as to improve the antifouling effect to the mold.

In the disclosure, the polymerizable compound preferably includes a bifunctional silane as a constituent unit, more than a trifunctional silane.

In the disclosure, the polymerizable compound preferably includes a spherical structure.

In the disclosure, the polymerizable compound is preferably a polyhedral siloxane oligomer including a completely or incompletely condensed skeleton to which the polymerizable functional group is bonded.

Such polymerizable compound is preferable since it may be easily obtained as a polymerizable compound wherein the ratio of oxygen atoms bonded to a single silicon atom, among oxygen atoms bonded to a silicon atom, is 10 mol % or less.

The present disclosure also provides a method for producing a photocurable resin composition for imprinting, wherein the photocurable resin composition for imprinting includes a polymerizable compound, and a photopolymerization initiator, the polymerizable compound includes a siloxane bond in a molecule, and includes at least one polymerizable functional group, and in order to obtain the polymerizable compound, the method comprising, a stabilizing step of adding a protective agent including a protective group configured to protect a highly reactive functional group, to a highly reactive polymerizable compound including the highly reactive functional group including a siloxane bond in a molecule, including at least one polymerizable functional group, and including an oxygen atom bonded to a single silicon atom.

By carrying out the above stabilizing step, it is possible to protect highly reactive functional group, having the high reactivity, bonded to the silicon atom included in the highly reactive polymerizable compound. Therefore, it is possible to easily produce a photocurable resin composition for imprinting having a high antifouling effect to an imprint mold and excellent in stability over time, such as the photocurable resin composition for imprinting described above.

The present disclosure also provides a method for producing a photocurable resin composition for imprinting, wherein the photocurable resin composition for imprinting includes a polymerizable compound, and a photopolymerization initiator, the polymerizable compound includes a siloxane bond in a molecule, and includes at least one polymerizable functional group, and the method comprising, a polymerizable compound synthesizing step of obtaining the polymerizable compound by subjecting a hydrolyzable silane composition, that includes a bifunctional silane more than a trifunctional silane and at least a part of the bifunctional silane includes the polymerizable functional group, to a hydrolysis condensation reaction under an acidic condition.

As described above, by using more bifunctional silane as a raw material of hydrolysis condensation reaction than trifunctional silane, it is possible to obtain a polymerizable compound wherein the ratio of unreacted oxygen atoms is reduced. Therefore, it is possible to more easily produce a photocurable resin composition for imprinting having a high antifouling effect to an imprint mold and excellent in stability over time, such as the photocurable resin composition for imprinting described above.

The present disclosure also provides a method for producing a photocurable resin composition for imprinting, wherein the photocurable resin composition for imprinting includes a polymerizable compound, and a photopolymerization initiator, the polymerizable compound includes a siloxane bond in a molecule, and includes at least one polymerizable functional group, and the method comprising, a polymerizable compound synthesizing step of obtaining the polymerizable compound by subjecting a hydrolyzable silane composition including at least a hydrolyzable silane, to a hydrolysis condensation reaction under a basic condition.

As described above, by subjecting a silane composition including trifunctional silane to hydrolysis condensation in a basic condition, a siloxane with a high degree of condensation may be obtained, and a polymerizable compound having a reduced ratio of unreacted oxygen atoms may be obtained. Therefore, it is possible to more easily produce a photocurable resin composition for imprinting having a high antifouling effect to an imprint mold and excellent in stability over time, such as the photocurable resin composition for imprinting described above.

The present disclosure also provides a method for producing a photocurable resin composition for imprinting, wherein the photocurable resin composition for imprinting includes a polymerizable compound, and a photopolymerization initiator, the polymerizable compound includes a siloxane bond in a molecule, and includes at least one polymerizable functional group, and the method comprising, a polymerizable compound synthesizing step of obtaining the polymerizable compound by reacting a polymerizable functional group containing compound with a polyhedral siloxane oligomer including a completely or incompletely condensed skeleton to which a hydrogen atom, a hydroxy group or an organic group other than the polymerizable functional group is bonded to a silicon atom.

Since polyhedral siloxane oligomer thus synthesized has a regular structure and polymerizable functional groups are bonded to each other, a polymerizable compound wherein the ratio of unreacted oxygen atoms is reduced may be obtained. Therefore, it is possible to more easily produce a photocurable resin composition for imprinting having a high antifouling effect to an imprint mold and excellent in stability over time, such as the photocurable resin composition for imprinting described above.

The present disclosure also provides a method for producing a pattern formed body, the method comprising steps of a coating step of: coating one main surface of a substrate with the photocurable resin composition for imprinting described above, a contacting step of contacting a surface of the substrate, coated with the photocurable resin composition for imprinting, with a mold including a concavoconvex structure on a surface, a curing step of curing the photocurable resin composition for imprinting, so as to be a photocured resin for imprinting, by irradiating light under a condition that the mold and the substrate are brought into contact with each other, and a peeling step of peeling the mold from the photocured resin for imprinting on the substrate surface.

Also, the present disclosure provides a method for producing a pattern formed body, the method comprising steps of: a coating step of coating a concavoconvex structure side surface of a mold including a concavoconvex structure on a surface thereof, with the photocurable resin composition for imprinting described above, a contacting step of contacting the substrate with a surface of the mold, coated with the photocurable resin composition for imprinting, a curing step of curing the photocurable resin composition for imprinting, so as to be a photocured resin for imprinting, by irradiating light under a condition that the mold and the substrate are brought into contact with each other, and a peeling step of peeling the mold from the photocured resin for imprinting on the substrate surface. Since photocurable resin composition for imprinting as described above is used, it is possible to minimize the cleaning of the mold used and to efficiently produce a pattern formed body.

Also, the present disclosure provides a photocured resin for imprinting comprising a siloxane bond, wherein a ratio of oxygen atoms bonded to a single silicon atom, among oxygen atoms bonded to a silicon atom included in the photocured resin for imprinting, is 10 mol % or less. By using such a photocured resin for imprinting as a resist, an antifouling effect to a mold may be exhibited.

Also, the present disclosure provides a method for producing an imprint mold, the method comprising a step of etching the substrate using the pattern formed body obtained according to the above described method for producing a pattern formed body, as a mask. Also, the present disclosure provides a method for producing a device, the method comprising a step of etching the substrate using the pattern formed body obtained according to the above described method for producing a pattern formed body, as a mask.

By using the pattern formed body including the photocured resin for imprinting having a high antifouling effect to an imprint mold as described above, an effective production is possible since an imprint mold which is an original plate may be washed preferably.

Advantageous Effects of Disclosure

The present disclosure is able to provide a photocurable resin composition for imprinting having a high antifouling effect to an imprint mold and also excellent in stability over time.

DESCRIPTION OF EMBODIMENTS

Figure 1A:
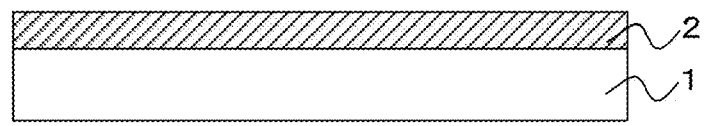
FIGS. 1A to 1D are schematic cross-sectional views illustrating an example of the method for producing a pattern formed body in the present disclosure.

Hereinafter, a photocurable resin composition for imprinting, a method for producing a photocurable resin composition for imprinting, a method for producing a pattern formed body, a photocured resin for imprinting, a method for producing a mold, and a method for producing a device in the present disclosure will be described in detail.

A. Photocurable Resin Composition for Imprinting

As described above, in view of the resist property, for example, a polymerizable compound including a silicone resin including a polysiloxane bond in a molecule is preferably used for the nanoimprint application.

Generally, in a polymer including a polysiloxane bond in a molecule, an oxygen atom is bonded to two silicon atoms. However, among the oxygen atoms, an oxygen atom bonded to a single silicon atom exist, for example, at the ends of the polymer. Such oxygen atoms usually constitute a highly reactive functional group with high reactivity, such as —OH or —OR (R represents an alkyl group with 1 to 4 carbons). The present inventors have completed the present invention by newly finding the following points: a stain difficult to be removed by cleaning occurs as the result of a highly reactive functional group included in such a polymerizable compound being chemically bonded to a constituent material of a mold made of, for example, quartz; and due to the existence of such a highly reactive functional group, the highly reactive functional group is reacted during storage of the photocurable resin composition for imprinting so that the molecular weight of the polymerizable compound is increased, thereby interfering the storage stability of the photocurable resin composition for imprinting.

In other words, the photocurable resin composition for imprinting in the present disclosure is characterized by comprising a polymerizable compound, and a photopolymerization initiator, wherein the polymerizable compound includes a siloxane bond in a molecule, and includes at least one polymerizable functional group, and a ratio of oxygen atoms bonded to a single silicon atom, among oxygen atoms bonded to a silicon atom included in the polymerizable compound, is 10 mol % or less.

Hereinafter, a photocurable resin composition for imprinting in the present disclosure (hereinafter, sometimes simply referred to as a resin composition) will be described in detail.

1. Polymerizable Compound

The polymerizable compound included in the resin composition in the present disclosure is not particularly limited as long as it is a polymerizable compound including a siloxane bond in a molecule and includes at least one polymerizable functional group. A polymer or oligomer including tetrafunctional silane, trifunctional silane, bifunctional silane, and monofunctional silane as a constituent unit may be used alone or in combination of a plurality of kinds.

In the present disclosure, it is preferable to use a combination mainly including a trifunctional silane and a bifunctional silane as a constituent unit, depending on desired properties for the resin composition, such as etching resistance and viscosity. Also, for the purpose of improving etching resistance, for example, a tetrafunctional silane may be included.

The polymerizable compound used in the present disclosure is characterized by a ratio of oxygen atoms bonded to a single silicon atom, among oxygen atoms bonded to a silicon atom included in the polymerizable compound, being 10 mol % or less, preferably 7 mol % or less, and particularly 5 mol % or less.

Here, an oxygen atom bonded to a single silicon atom means an oxygen atom wherein one hand among the two hands of an oxygen atom is bonded to silicon, and means not an oxygen atom wherein both of the two hands of an oxygen atom are bonded to a silicon atom. The other hand of the oxygen atom is not particularly limited as long as it is bonded to other than silicon, and is preferably bonded to a hydrogen, or an alkyl group with 1 to 4 carbons, in particular.

In the present disclosure, the ratio of the above described oxygen atoms bonded to a single silicon atom, that is, the ratio of highly reactive functional group, having a high reactivity such as —OH or —OR (R represents an alkyl group with 1 to 4 carbons), bonded to a silicon atom is in the above range. Thereby, stability over time of the resin composition may be improved, and the resin composition may be suppressed from being reacted with the mold surface and being firmly adhered to the mold.

The reason of the existence of the highly reactive functional group as described above in the polymerizable compound at a constant ratio is presumed to be an unreacted oxygen atom remaining in the process of producing the polymerizable compound.

As a reason for such unreacted oxygen atoms remaining, in the case of —OR (R represents an alkyl group with 1 to 4 carbons), the hydrolysis of the alkoxy group of the raw material not being proceeded is considered to be a cause, and in the case of —OH, the polymerization reaction not being proceeded completely due to, for example, steric hindrance is considered to be a cause.

In the present disclosure, the ratio of oxygen atoms bonded to a single silicon atom indicates the number of oxygen atoms bonded to a single silicon atom, when the number of oxygen atoms bonded to a silicon atom in the polymerizable compound is regarded as 100.

As for the method for measuring this ratio, the ratio may be calculated by analyzing the spectrum with $^{29}$Si NMR.

Specifically, when a composition including a siloxane structure including a trifunctional silane as a constituent unit is analyzed with NMR, the following four peaks are observed: component $T^0$ wherein none of the three oxygen atoms bonded to the silicon atom is bonded to other silicon atom; component $T^1$ wherein one of the three oxygen atoms bonded to the silicon atom is bonded to other silicon atom; component $T^2$ wherein two of the three oxygen atoms bonded to the silicon atom are bonded to other silicon atom; and component $T^3$ wherein all of the three oxygen atoms bonded to the silicon atom are bonded to other silicon atom.

The value obtained by integrating these four peaks ($T^0$-$T^3$) that is, when the ratio of each area is regarded as $T^0$-$T^3$, the ratio (mol %) of the oxygen atoms bonded to a single silicon atom may be calculated from the following equation (1).

$$(T^0 \times 3 + T^1 \times 2 + T^2 \times 1 + T^3 \times 0)/((T^0+T^1+T^2+T^3)\times 3) \times 100 \quad (1)$$

Also, when a siloxane structure including a bifunctional silane as a constituent unit is included in the composition, the following three peaks are observed: a component wherein all of the two oxygen atoms bonded to the silicon atom are not bonded to other silicon atom; a component wherein one of the two oxygen atoms bonded to the silicon atom is bonded to other silicon atom; and a component wherein all of the two oxygen atoms bonded to the silicon atom are bonded to other silicon atom.

The value obtained by integrating these three peaks, that is, when the ratio of each area is regarded as $D^0$-$D^2$, the ratio (mol %) of the oxygen atoms bonded to a single silicon atom may be calculated from the following equation (2).

$$(D^0 \times 2 + D^1 \times 1 + D^2 \times 0)/((D^0+D^1+D^2)\times 2) \times 100 \quad (2)$$

Further, when a siloxane structure including a tetrafunctional silane as a constituent unit is included in the composition, the following five peaks are observed: a component wherein all of the four oxygen atoms bonded to the silicon atom are not bonded to other silicon atom; a component wherein one of the four oxygen atoms bonded to the silicon atom is bonded to other silicon atom; a component wherein two of the four oxygen atoms bonded to the silicon atom are bonded to other silicon atom; a component wherein three of the four oxygen atoms bonded to the silicon atom are bonded to other silicon atom; and a component wherein all of the four oxygen atoms bonded to the silicon atom are bonded to other silicon atom.

The value obtained by integrating these five peaks, that is, when the ratio of each area is regarded as $Q^0$-$Q^4$, the ratio (mol %) of the oxygen atoms bonded to a single silicon atom may be calculated from the following equation (3).

$$(Q^0 \times 4 + Q^1 \times 3 + Q^2 \times 2 + Q^3 \times 1 + Q^4 \times 0)/((Q^0+Q^1+Q^2+Q^3+Q^4)\times 4) \times 100 \quad (3)$$

For example, when the polymerizable compound, including two types of trifunctional silane and bifunctional silane as constituent units, is included in the resin composition, the value is calculated by;

$$((T^0 \times 3 + T^1 \times 2 + T^2 \times 1 + T^3 \times 0)+(D^0 \times 2 + D^1 \times 1 + D^2 \times 0))/((T^0+T^1+T^2+T^3)\times 3+(D^0+D^1+D^2)\times 2) \times 100$$

The value, calculated by carrying out to the resin composition in the present disclosure, is used for the spectrum analysis by the $^{29}$Si NMR.

The weight average molecular weight of the polymerizable compound is preferably in a range of 500 to 100000, and particularly preferably in a range of 600 to 50000, and among them, preferably in a range of 700 to 20000.

The weight average molecular weight (Mw) is a molecular weight measured by gel permeation chromatography (GPC), calculated relative to polystyrene standards, and is a value measured under the following conditions, after pressure filtration through a membrane filter having a filter pore diameter of 0.2 μm.

(Conditions)
Device: Water 2695
Sample volume: approximately 10 mg of sample per 3 ml of solvent
Injection volume: 5 μl
Guard Column: LF-G (Shodex)
Column: GPC LF-804×3 columns (Shodex)
Column temperature: 40° C.
Mobile phase: tetrahydrofuran
Flow rate: 1.0 ml/min
Detector: Differential Refractometer (Water 2414)
Molecular weight calibration: calculated relative to polystyrene standards The polymerizable functional group included in the polymerizable compound is not particularly limited as long as it is a functional group capable of carrying out a polymerization reaction and the polymerization reaction proceeds by stimulus from the outside, and for example, an acryloyl group, a methacryloyl group, an epoxy group, an oxetane group, and a vinyl ether group wherein a polymerization reaction is proceeded by, for example, light irradiation, heat accompanying light irradiation, and function of a photo-acid generator may be used. This is because, if such a polymerizable functional group is used, stability during synthesis and storage and reactivity during curing are good, and further, the raw material is easily available.

In the present disclosure, acryloyl groups and methacryloyl groups are particularly preferable in view of curing rate and the wide range of physical property selectivity.

When the polymerizable group directly linked to the silicon atom in the polymerizable compound is bulky, the molecular weight of the polymerizable group directly linked to the silicon atom is preferably in a range of 20 to 500, and among them, in a range of 25 to 400, taking into consideration that the reactivity may be changed due to steric hindrance, and may affect curability. Incidentally, in the present disclosure, a polymerizable group (photopolymerizable group) refers to a group including a polymerizable functional group.

As such a polymerizable group, preferred examples thereof may include structures shown below.

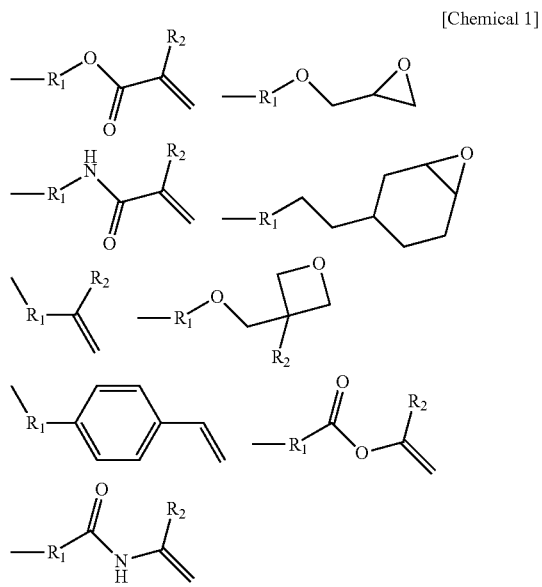

[Chemical 1]

(Here, $R_1$ means a substituted or unsubstituted alkyl chain with 1 to 10 carbons, $R_2$ means a substituted or unsubstituted alkyl chain with 1 to 3 carbons, or a hydrogen atom; both $R_1$ and $R_2$ may be straight or branched.)

At least one polymerizable functional group may be bonded to the constituent unit of the polymerizable compound. However, it is not limited thereto, and two or more of them may be bonded.

Preferable examples of the constituent unit including a photopolymerizable group in the polymerizable compound used in the present disclosure may include the followings.

Firstly, examples of a trifunctional constituent unit may include 3-acryloxypropyltrimethoxysilane, 3-acryloxypropyltriethoxysilane, 3-methacryloxypropyltrimethoxysilane, 3-methacryloxypropyltriethoxysilane, vinyltrimethoxysilane, vinyltriethoxysilane, allyltrimethoxysilane, allyltriethoxysilane, styryltrimethoxysilane, styryltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 3-ethyl-3-[3'-(trimethoxysilyl)propyl]methyloxetane, and 3-ethyl-3-[3'-(triethoxysilyl)propyl]methyloxetane. Among them, for example, 3-acryloxypropyltrimethoxysilane, 3-acryloxypropyltriethoxysilane, 3-methacryloxypropyltrimethoxysilane, 3-methacryloxypropyltrimethoxysilane, 3-methacryloxypropyltriethoxysilane, vinyltrimethoxysilane, vinyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 3-ethyl-3-[3'-(trimethoxysilyl)propyl]methyloxetane, and 3-ethyl-3-[3'-(triethoxysilyl)propyl]methyloxetane may be preferably used.

Also, examples of a bifunctional constituent unit may include 3-acryloxypropyl (methyl)dimethoxysilane, 3-acryloxypropyl (methyl)diethoxysilane, 3-methacryloxypropyl (methyl)dimethoxysilane, 3-methacryloxypropyl (methyl)diethoxysilane, vinyl (methyl)dimethoxysilane, vinyl (methyl)diethoxysilane, allyl (methyl)dimethoxysilane, allyl (methyl)diethoxysilane, styryl (methyl)dimethoxysilane, styryl (methyl)diethoxysilane, 3-glycidoxypropylmethyldietoxysilane, 3-glycidoxypropylmethyldimetoxysilane, 2-(3,4-epoxy cyclohexyl)ethyl(methyl)dimethoxysilane, 2-(3,4-epoxy cyclohexyl)ethyl(methyl)diethoxysilane), 3-ethyl-3-[3'-(methyldimethoxysilyl)propyl]methyloxetane, 3-ethyl-3-[3'-(methyldiethoxysilyl)propyl]methyloxetane, dimethoxymethyl vinylsilane, and diethoxymethyl vinylsilane. Among them, 3-acryloxypropyl (methyl)dimethoxysilane, 3-acryloxypropyl (methyl)diethoxysilane, 3-methacryloxypropyl (methyl)dimethoxysilane, 3-methacryloxypropyl (methyl)diethoxysilane, vinyl (methyl)dimethoxysilane, vinyl (methyl)diethoxysilane, 3-glycidoxypropylmethyldietoxysilane, 3-glycidoxypropylmethyldimetoxysilane, 2-(3,4-epoxy cyclohexyl)ethyl(methyl) dimethoxysilane, 2-(3,4-epoxy cyclohexyl)ethyl(methyl) diethoxysilane, 3-ethyl-3-[3'-(methyldimethoxysilyl) propyl]methyloxetane, and 3-ethyl-3-[3'-(methyldiethoxysilyl)propyl]methyloxetane may be preferably used.

Also, a constituent unit including no photopolymerizable group may be used in combination with the constituent unit including a photopolymerizable group. Examples of a trifunctional constituent unit including no photopolymerizable group may include trimethoxy (methyl) silane, triethoxy (methyl)silane, methyltripropoxysilane, tributoxy(methyl) silane, methyltriphenoxysilane, ethyltrimethoxysilane, triethoxy(ethyl)silane, ethyltripropoxysilane, tributoxy (ethyl) silane, ethyltriphenoxysilane, trimethoxy(propyl)silane, triethoxy(propyl)silane, tripropoxy(propyl)silane, tributoxy (propyl)silane, triphenoxy(propyl)silane, butyltrimethoxysilane, butyltriethoxysilane, butyltripropoxysilane, tributoxy (butyl)silane, butyltriphenoxysilane, trimethoxy(phenyl) silane, triethoxy(phenyl)silane, phenyltripropoxysilane, tributoxy(phenyl)silane, triphenoxy(phenyl)silane, cyclohexyltrimethoxysilane, cyclohexyltriethoxysilane, cyclohexyltriproxysilane, cyclohexyltributoxysilane, and cyclohexyltriphenoxysilane. Among them, trimethoxy(methyl) silane, triethoxy(methyl)silane, ethyltrimethoxysilane, triethoxy(ethyl)silane, trimethoxy(phenyl)silane, triethoxy (phenyl)silane, cyclohexyltrimethoxysilane, and cyclohexyltriethoxysilane may be preferably used.

Also, examples of a bifunctional constituent unit may include dimethoxydimethylsilane, diethoxydimethylsilane, methylphenyldimethoxysilane, methylphenyldiethoxysilane, cyclohexyl (dimethoxy) methylsilane, cyclohexyldiethoxymethylsilane, dimethoxydiphenylsilane, diethoxydiphenylsilane, dimethoxymethylvinylsilane, and diethoxymethylvinylsilane.

As described above, the structure of the polymerizable compound in the present disclosure is not limited as long as it includes a siloxane bond in a molecule; includes at least one polymerizable functional group; and the ratio of oxygen atoms bonded to a single silicon atom, among oxygen atoms bonded to a silicon atom included in the polymerizable compound, is 10 mol % or less. Examples thereof may include the first to the third polymerizable compounds as exemplified below. Such a polymerizable compound is preferable in that a method for producing a resin composition capable of having the following feature exists; the ratio of oxygen atoms bonded to a single silicon atom, among oxygen atoms bonded to a silicon atom, is 10 mol % or less.

(1) First Polymerizable Compound

The first polymerizable compound in the present disclosure includes a bifunctional silane as a constituent unit, more than a trifunctional silane in molar amount. That is, it includes the constituent unit derived from the bifunctional silane, more than the constituent unit derived from the trifunctional silane. By including the bifunctional silane as the constituent unit, more than the trifunctional silane, it is possible to reduce the amount of highly reactive functional groups having high reactivity, such as the residual —OH amount or —OR amount (R represents an alkyl group with 1 to 4 carbons). The reason therefor is presumed as follows.

That is, since the steric hindrance of the oxygen atom bonded to the silicon atom included in the bifunctional silane is small as compared to the oxygen atom bonded to the silicon atom included in the trifunctional silane, the hydrolytic reaction or the condensation reaction is easily proceeded. Therefore, it is presumed that the residual —OH amount or —OR amount may be reduced. The constituent unit derived from the bifunctional silane is a cross-linked unit derived from the above described bifunctional silane, and is a so-called D unit. The constituent unit derived from the trifunctional silane is a cross-linked unit derived from the above described trifunctional silane, and is a so-called T unit.

Further, as will be described later, by selecting the type and molar ratio of the bifunctional silane or the trifunctional silane as a raw material, the ratio of oxygen atoms bonded to a single silicon atom, among the oxygen atoms bonded to the silicon atom included the polymerizable compound, is further reduced. In such a first polymerizable compound, only the bifunctional silane may be included as the constituent unit.

Also, in the present disclosure, the photopolymerizable group may be included in at least one of the bifunctional silane and the trifunctional silane. However, it is preferable that at least a part of the bifunctional silane includes the photopolymerizable group (a group including a polymerizable functional group). The reason therefor is to reduce the amount of highly reactive functional group having high reactivity, such as the residual —OH amount or the —OR amount, more reliably. Also, the content ratio, for example, of the photopolymerizable group is appropriately determined depending on the required conditions such as reactivity.

As the trifunctional silane constituting the first polymerizable compound, those represented by the following formula (a) are preferable. As the bifunctional silane constituting the first polymerizable compound, those represented by the following formula (b) are preferable.

[Chemical 2]

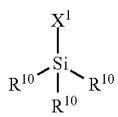

(a)

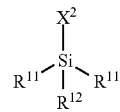

(b)

(Wherein $X^1$ and $X^2$ are independently a hydrogen atom, a substituted or unsubstituted alkyl group, a substituted or unsubstituted phenyl group, or the polymerizable group described above, and $R^{10}$ and $R^{11}$ are independently a hydrolyzable group, and $R^{12}$ is an alkyl group.)

$X^1$ and $X^2$ are independently a hydrogen atom, a substituted or unsubstituted alkyl group, a substituted or unsubstituted phenyl group, or the polymerizable group described above, and at least one of $X^1$ and $X^2$ included in the bifunctional silane and the trifunctional silane constituting the polymerizable compound, is the polymerizable group. The polymerizable group of $X^1$ and $X^2$ may be similar to the polymerizable group described above; $X^1$ is preferably an alkyl group or a polymerizable group having a relatively small bulk, specifically, a group having a molecular weight of 1 to 400 is preferable, and particularly preferably a 3-acryloxypropyl group or a 3-methacryloxypropyl group.

As $X^2$, a relatively bulky alkyl group or a polymerizable group is preferable, and specifically, a group having a molecular weight of 1 to 700 is preferable, and particularly preferably a 3-metallyloxypropyl group.

As described above, when $X^1$ is a hydrogen atom, a substituted or unsubstituted alkyl group, a substituted or unsubstituted phenyl group or a polymerizable group having a relatively small bulk, the remaining unreacted oxygen atom is further reduced. Also, when $X^2$ is a relatively bulky alkyl group or polymerizable group, the stability of the polymerizable compounds may be improved by inhibiting the remaining unreacted oxygen atoms from reacting.

Examples of $R^{10}$ and $R^{11}$ may include an alkoxy group with 1 to 4 carbons, and preferably a methoxy group and an ethoxy group. As $R^{12}$, for example, a methyl group is preferable.

When both of the bifunctional silane and the trifunctional silane are included as constituent units, the ratio (molar ratio) thereof is preferably 100:0 to 51:49.

Specific examples of such a polymerizable compound may include siloxanes represented by the following average formula (c).

$$(X^1SiO_{3/2})n(X^2R^{12}SiO_{2/2})m \qquad (c)$$

(Wherein, $X^1$, $X^2$, and $R^{12}$ are the same as above. The "n" is 0 to 0.35, "m" is 0.65 to 1, and are numbers satisfy n+m=1.)

The siloxane usually includes a branched chain structure. Also, the siloxane unit in parentheses marked with "n" and the siloxane unit in parentheses marked with "m" may be randomly arranged with each other, and may be arranged in blocks.

The first polymerizable compound may be synthesized by a method described later.

(2) Second Polymerizable Compound

In the present disclosure, it is preferable that the polymerizable compound includes a spherical structure. Examples of the polymerizable compound including the spherical structure may include those including a trifunctional silane as a constituent unit. Among them, those including only the trifunctional silane as a constituent unit are preferable. Examples of the second polymerizable compound including such a spherical structure may include one kind or a mixture of two kinds or more of 6 mers to 36 mers (molecular weight of 1000 or more and 6300 or less) of a trifunctional silane including a polymerizable functional group.

The siloxane including such a trifunctional silane usually includes a structure wherein the polymerizable functional group stretches outward, centering a siloxane polymer portion with high degree of siloxane condensation including $SiO_{3/2}$ unit. Since the degree of siloxane condensation in the siloxane polymer portion, of the polymerizable compound including such a spherical structure is higher than 90%, and particularly, it may be 95% or more, the ratio of oxygen atoms bonded to a single silicon atom, among oxygen atoms bonded to a silicon atom included in the polymerizable compound, will be 10 mol % or less.

The reason therefor is presumed as follows. That is, when the trifunctional silane is hydrolyzed under a basic condition, a OH nucleophilic reaction occurs with respect to the Si atom. The hydrolysis reaction rate increases since the steric hindrance of the Si atom decreases due to the hydrolysis of one hydrolyzable group (alkoxy group), so that —Si(OH)$_3$ wherein all of the three hydrolyzable groups (alkoxy group) are hydrolyzed, is produced. Since all of the OH groups of the —Si(OH)$_3$ are capable of condensation polymerization, a siloxane structure with high density and high degree of condensation is formed three-dimensionally.

Specifically, it includes the spherical structure represented by the following formulas. Incidentally, the following formulas are diagrams respectively showing a polymerizable compound including the spherical structure including a 8 mer of a trifunctional silane including an acryloxypropyl group and a 3-methacryloxypropyl group as polymerizable groups.

[Chemical 3]

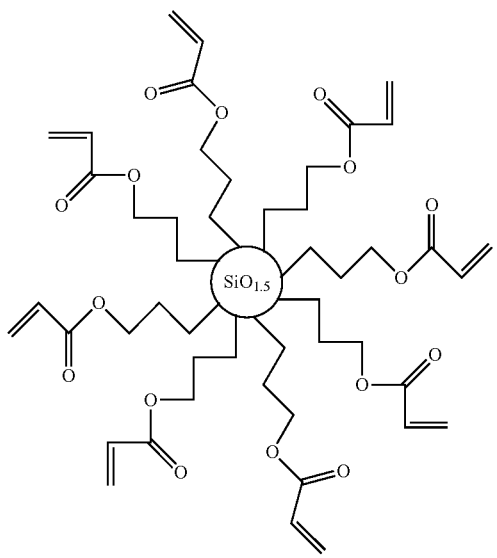

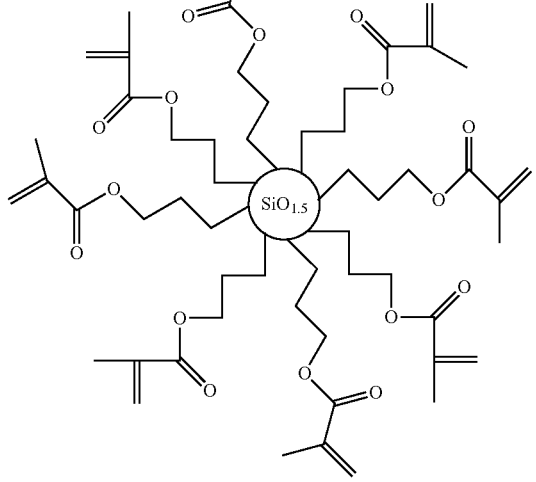

(Wherein $SiO_{1.5}$ represents a siloxane polymer portion including $SiO_{3/2}$ unit.)

(3) Third Polymerizable Compound

Also, examples of the polymerizable compound in the present disclosure may include a polyhedral siloxane oligomer including a completely or incompletely condensed skeleton to which the polymerizable functional group is bonded. Since such a third polymerizable compound includes a regular structure, the ratio of oxygen atoms bonded to a single silicon atom, among oxygen atoms bonded to a silicon atom included in the polymerizable compound, will be 10 mol % or less.

The polyhedral siloxane oligomer, including a completely condensed skeleton to which a polymerizable functional group is bonded, includes a silicon atom at the apex of a cube, and includes an oxygen atom therebetween; specifically it includes a structure represented by the formula $(R^{15}SiO_{1.5})_n$ (wherein "n" is 6, 8, 10, 12 or 14, and $R^{15}$ is a polymerizable group including a polymerizable functional group), or the formula $(SiO_2)_n$, (wherein "n" is 6, 8, 10, 12 or 14), to which a polymerizable group $R^{16}$ including a polymerizable functional group is bonded. In particular, those represented by the following formulas are preferable.

[Chemical 4]

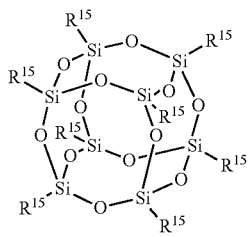

-continued

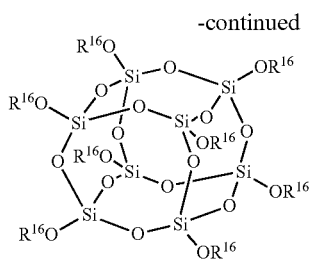

(Wherein $R^{15}$ and $R^{16}$ are polymerizable groups.)

Also, examples of the polyhedral siloxane oligomer, including an incompletely condensed skeleton to which the polymerizable functional group is bonded, may include the $(R^{15}SiO_{1.5})_n$ structure described above, and an incompletely condensed type of the $(SiO_2)_n$ structure described above wherein one apex, one side, or one surface is missing; and in particular, those represented by the following formulas are preferable.

[Chemical 5]

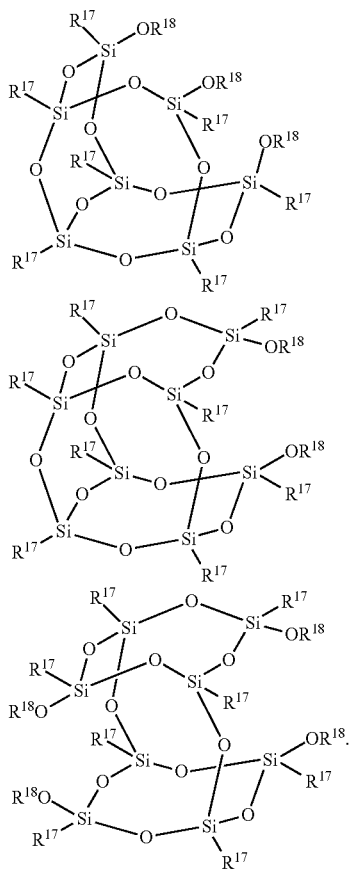

(Wherein $R^{18}$ is a —Si-polymerizable group, a hydrogen atom, a metal ion such as Na, and Li, or a tetraalkylammonium ion (as the alkyl group, for example, methyl, ethyl, propyl, and butyl) bonded to an oxygen atom in the formula, and $R^{17}$ is a one valent hydrocarbon group.)

$R^{17}$ is a one valent hydrocarbon group, and preferably an alkyl group with 1 to 5 carbons, and a phenyl group, and specifically, an ethyl group, a butyl group, and a phenyl group.

The polyhedral siloxane oligomer, including a completely or incompletely condensed skeleton to which such a polymerizable functional group is bonded, is useful as a photocurable resin composition for nanoimprinting because of its small molecular size and tendency to enter gaps between fine patterns. In particular, a composition including the incompletely condensed polyhedral siloxane oligomer, to which a polymerizable functional group is bonded, is preferable for decreasing the viscosity.

2. Photopolymerization Initiator

The photopolymerization initiator is a substance that generates a reactive species causing a polymerization reaction of a polymerizable compound by light stimulus. Specific examples thereof may include a photoradical generator wherein radicals are generated by light stimulus, and a photoacid generator wherein protons are generated by light stimulus. The photoradical generator is a polymerization initiator which generates radicals by light (charged particle radiation such as infrared rays, visible rays, ultraviolet rays, far ultraviolet rays, X-rays, and electron beams; and radioactive rays), and is mainly used when the polymerizable compound is a radical polymerizable compound. Meanwhile, the photoacid generator is a polymerization initiator which generates an acid (proton) by light, and is mainly used when the polymerizable compound is a cation polymerizable compound.

Examples of the photoradical generator may include 2,4,6-trimethyldiphenylphosphine oxide, 2,2-dimethoxy-2-phenylacetophenone, 2-methyl-1-[4-(methylthio)phenyl]-2-morpholino-propane-1-one, 2-benzilic-2-dimethylamino-1-(4-morpholinophenyl)-1-butanone, 2-(dimethylamino)-2-[(4-methylphenyl)methyl]-1-[4-(4-morpholinyl)phenyl]-1-butanone, 2-hydroxy-2-methyl-1-phenyl-propan-1-one, and 2-hydroxy-2-methyl-1-phenyl-propan-1-one, although not limited thereto. Incidentally, one kind of these photoradical generator may be used alone, and two kinds or more thereof may be used in combination.

Examples of the photoacid generator may include an onium salt compound, a sulfone compound, a sulfonic acid ester compound, a sulfonimide compound, and a diazomethane compound, although not limited thereto.

The content of the photopolymerization initiator in the resin composition in the present disclosure is not particularly limited, and may be in a range of 0.5 mass % to 20 mass %, and may be in a range of 1 mass % to 10 mass %, based on the polymerizable compound.

3. Optional Components

The resin composition in the present disclosure may include an optional component other than the polymerizable compound and the photopolymerization initiator described above. For example, for the purpose of improving releasability from an imprint mold, a surfactant such as a fluorine-based surfactant, a hydrocarbon-based surfactant, and a silicone-based surfactant may be included. Among them, a fluorine-based surfactant and a silicone-based surfactant may be preferably used. The reason therefor is to reduce the releasing force, since it is easily segregated at the surface.

Examples of the fluorine-based surfactant may include a polyalkylene oxide (such as polyethylene oxide, and polypropylene oxide) adduct of an alcohol including a perfluoroalkyl group; and a polyalkylene oxide (such as polyethylene oxide, and polypropylene oxide) adduct of a perfluoropolyether. Incidentally, the fluorine-based surfactant may include, for example, a hydroxyl group, an alkoxy group, an alkyl group, an amino group, and a thiol group as a part of the molecular structure (such as a terminal group).

Also, examples of the silicone-based surfactant may include a polydimethylsiloxane derivative including a polymerizable group such as an acryloyl group, a (meta)

acryloyl group, an epoxy group, an oxetane group, and a vinyl ether group. Incidentally, the silicone-based surfactant may include, for example, a hydroxyl group, an alkoxy group, an alkyl group, an amino group, and a thiol group as a part of the molecular structure (such as a terminal group).

The content of such a fluorine-based surfactant is not particularly limited, and may be, for example, 10 mass % or less, and among them, 5 mass % or less, based on the total solid content of the resin composition. This is because, when the content is too low, the releasability improving effect may not be sufficiently obtained in some cases, and when the content is too high, there is a possibility that a problem such as a change in the size of the concavoconvex pattern shape or bleeding may occur.

The resin composition may include a solvent for the purpose of, for example, adjusting the viscosity thereof. Also, it is also possible to include, for example, an organic pigment, an inorganic pigment, an extender pigment, an organic filler, an inorganic filler, a photosensitizer, an ultraviolet absorber, an antioxidant, a polymerization inhibitor, a surfactant, and an adhesion aid, within a range that does not impair the effect of the present disclosure.

4. Others

The method for producing the photocurable resin composition for imprinting in the present disclosure is not particularly limited as long as it is a method capable of producing a desired product. For example, it may be produced according to the method for producing described in "B. Method for producing photocurable resin composition for imprinting", which will be described later.

As described above, the highly reactive functional group is not particularly limited as long as it is —OH or —OR (R represents an alkyl group with 1 to 4 carbons). However, it is preferably —OH or —OR (R represents an alkyl group with 1 to 2 carbons), and is particularly preferably —OH, since the higher the reactivity, the more remarkably the working effect in the present disclosure is exhibited.

B. Method for Producing Photocurable Resin Composition for Imprinting

The method for producing a photocurable resin composition for imprinting in the present disclosure is characterized by the photocurable resin composition for imprinting including a polymerizable compound, and a photopolymerization initiator, the polymerizable compound includes a siloxane bond in a molecule, and includes at least one polymerizable functional group, and in order to obtain the polymerizable compound, the method comprising, a stabilizing step of adding a protective agent including a protective group configured to protect a highly reactive functional group, to a highly reactive polymerizable compound including the highly reactive functional group including a siloxane bond in a molecule, including at least one polymerizable functional group, and including an oxygen atom bonded to a single silicon atom.

Since the ratio of the highly reactive functional group including an oxygen atom bonded to a single silicon atom, is high in the curable resin composition including a siloxane bond in a molecule produced by a conventional method for producing, the stability over time of the resin composition is inferior. Also, when such a resin composition is used as a resist material in imprint lithography, the resin composition is adhered to an imprint mold, so that it has been difficult to maintain the imprint mold clean.

Meanwhile, in the present disclosure, by using the method for producing as described above, it is possible to produce a photocurable resin composition for imprinting having a high antifouling effect to an imprint mold and also excellent in stability over time, as the resin composition described in the section of "A. Photocurable resin composition for imprinting" described above.

In the present disclosure, in the stabilizing step, by adding a protective agent to react a protective group with the highly reactive functional group, the ratio of the highly reactive functional group is reduced. Thereby, a resin composition exhibiting the above described operational effect may be produced.

As such a protective group, a monofunctional group, particularly a monofunctional silane, is preferable.

As a protective agent including such a protective group, it is preferably a monofunctional silane compound, and particularly, a protective agent including a halogen atom at its terminal is preferable for it high reactivity, and specific examples thereof may include a compound represented by the following formula (1).

[Chemical 6]

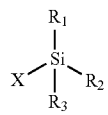

(1)

In the formula, X is a halogen atom, and $R_1$-$R_3$ may be respectively an alkyl group with 1 to 5 carbons. The number of carbons is preferably small because of high reactivity. However, when a problem arises in compatibility with the polymerizable compound, an alkyl group with a large number of carbons may be used in a part.

In the present disclosure, X is preferably a chlorine, and $R_1$-$R_9$ is preferably an alkyl group with 1 to 2 carbons, respectively.

Also, as the protective agent, a protective agent that exhibits the function as the protective group by being decomposed, may be used. Specific examples thereof may include a compound represented by the following formula (2).

[Chemical 7]

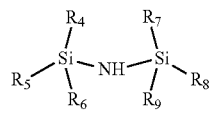

(2)

In the formula (2), $R_4$-$R_9$ may be an alkyl group with 1 to 5 carbons, respectively. In this case as well, the number of carbons is preferably small from the viewpoint of reactivity. However, an alkyl group with large number of carbons may be used in a part in consideration of the compatibility with the polymerizable compound.

In the present disclosure, $R_4$-$R_9$ is preferably an alkyl group with 1 to 2 carbons, respectively.

Also, $HSi(R_{10})_3$ may be used ($R_{10}$ is an alkyl group with 1 to 2 carbons, and all of which may be the same or different) as a protective agent in the present disclosure.

In this case, it is preferable to use a catalyst. As the catalyst, for example, tris (pentafluorophenyl) borane may be used.

The stabilizing step in the present disclosure is a step of adding and diffusing the protective agent to the resin composition including a highly reactive polymerizable compound and reacting the above, or a step of adding and diffusing a resin composition including the highly reactive polymerizable compound to a composition including the protective agent.

In the stabilizing step, heating, for example, may be performed if necessary, and a catalyst, for example, may be added.

In the present disclosure, the amount of the protective agent added is appropriately determined according to the amount of the highly reactive functional group included in the polymerizable compound included in the resin composition.

For example, 0.5 to 100 times, preferably 0.7 to 50 times, more preferably 0.8 to 25 times in molar ratio of the protective agent is added to the amount of the highly reactive functional group determined by the method described above.

In the present disclosure, from the viewpoint of antifouling property and stability over time of the resin composition to be obtained, the amount is preferably an amount wherein the ratio of the highly reactive functional group may be reduced to 10 mol % or less, and among them, 7 mol % or less.

Incidentally, since the method of calculating the ratio is the same as that described in the section of "A. Photocurable resin composition for imprinting" described above, a description thereof will be omitted here.

Also, in the present disclosure, by synthesizing the polymerizable compound according to the following first synthesizing step to the third synthesizing step, it is possible to directly obtain a polymerizable compound wherein the ratio of oxygen atoms (unreacted oxygen atoms) bonded to a single silicon atom is reduced, particularly, reduced to 10 mol % or less.

(1) First Synthesizing Step

The first synthesizing step is a step of obtaining the polymerizable compound by subjecting a hydrolyzable silane composition that includes one kind or more of a bifunctional silane and one kind or more of other hydrolyzable silane if necessary, so that the bifunctional silane is included more than a trifunctional silane in molar amount, and at least a part of the bifunctional silane includes the polymerizable functional group, to a hydrolysis condensation reaction under an acidic condition.

Specifically, it may be carried out by charging a solvent and a silane as a raw material into a reactor, adding an acid as a catalyst, and adding water dropwise while stirring. Examples of the acid catalyst may include hydrochloric acid, sulfuric acid, phosphoric acid, nitric acid, and acetic acid, PH may be 1 to 6, and may be typically carried out at room temperature.

As the silane as the raw material, one kind or more bifunctional silane and, if necessary, one kind or more of other hydrolyzable silane (particularly preferably, trifunctional silane) are used. At least a part of the bifunctional silane includes a polymerizable functional group, and in particular, as the bifunctional silane, those represented by the above formula (b) are preferable. The trifunctional silane may or may not include a polymerizable functional group, and examples thereof may include those represented by the above formula (a). By increasing the molar ratio of the bifunctional silane, it is possible to further reduce the ratio of oxygen atoms bonded to a single silicon atom, among oxygen atoms bonded to a silicon atom included in the polymerizable compound.

By such a method for producing, it is possible to easily obtain a polymerizable compound wherein the ratio of oxygen atoms bonded to a single silicon atom, among oxygen atoms bonded to a silicon atom included in the polymerizable compound is reduced, particularly, reduced to 10 mol % or less. Specifically, it is possible to produce the first polymerizable compound described above.

(2) Second Synthesizing Step

The second synthesizing step is a polymerizable compound synthesizing step of obtaining the polymerizable compound by subjecting a hydrolyzable silane composition including at least a hydrolyzable silane, to a hydrolysis condensation reaction under a basic condition.

Specifically, it may be carried out by charging a solvent and a silane as a raw material into a reactor, adding a basic substance as a catalyst, and adding water dropwise while stirring. Examples of basic catalysts may include sodium hydroxide, potassium hydroxide, lithium hydroxide, potassium carbonate ($K_2CO_3$), sodium carbonate, and ammonia, PH may be 8 to 13, and typically may be carried out at room temperature.

The silane as the raw material may be any one kind or more of quatrofunctional hydrolyzable silane, trifunctional hydrolyzable silane, bifunctional hydrolyzable silane, and monofunctional hydrolyzable silane. It is preferable to use a quatrofunctional hydrolyzable silane or trifunctional hydrolyzable silane. Also, only one kind of hydrolyzable silane may be used, and two kinds or more thereof may be used in combination.

As described above, by using the basic catalyst as the catalyst in the synthesizing step, the degree of condensation of the polymerizable compound obtained in the hydrolysis condensation reaction will be high. Therefore, a polymerizable compound wherein the ratio of oxygen atoms bonded to a single silicon atom, among the oxygen atoms bonded to the silicon atom, is reduced, particularly, reduced to 10 mol % or less, may be easily obtained. Specifically, it is possible to produce a polymerizable compound including a spherical structure, such as the second polymerizable compound described above.

(3) Third Synthesizing Step

The third synthesizing step is a polymerizable compound synthesizing step of obtaining the polymerizable compound by reacting a polymerizable functional group containing compound with a polyhedral siloxane oligomer including a completely or incompletely condensed skeleton to which a hydrogen atom, a hydroxy group or an organic group other than the polymerizable functional group is bonded to a silicon atom.

A polyhedral siloxane oligomer including a completely or incompletely condensed skeleton, as a raw material is one wherein a hydrogen atom, a hydroxy group, or an organic group other than the polymerizable functional group is bonded to a silicon atom located at an apex.

Examples of the organic group other than the polymerizable functional group may include an alkoxy group, an alkyl group, and a phenyl group.

Examples of the reaction of the raw material with the polymerizable functional group containing compound may include conventionally known reactions. Examples thereof may include an addition reaction of a hydrogen atom directly bonded to silicon and a polymerizable functional group containing compound including an unsaturated double bond; and a reaction of an OH group or an OR group directly bonded to silicon and a polymerizable functional group containing compound capable of forming a siloxane bond.

C. Method for Producing a Pattern Formed Body

The method for producing a pattern formed body in the present disclosure is characterized by comprising steps of: a coating step of coating one main surface of a substrate with the photocurable resin composition for imprinting described above, a contacting step of contacting a surface of the substrate, coated with the photocurable resin composition for imprinting, with a mold including a concavoconvex structure on a surface, a curing step of curing the photocurable resin composition for imprinting, so as to be a photocured resin for imprinting, by irradiating light under a condition that the mold and the substrate are brought into contact with each other, and a peeling step of peeling the mold from the photocured resin for imprinting on the substrate surface.

FIGS. 1A to 1D show an example of the method for producing a pattern formed body in the present disclosure. First, as shown in FIG. 1A, one surface of substrate 1 is coated with the resin composition described in the section "A. Photocurable resin composition for imprinting" described above, to form a layer of resin composition 2 (coating step).

Figure 1B:
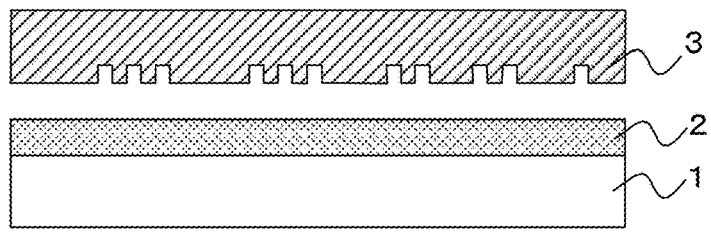
Figure 1C:
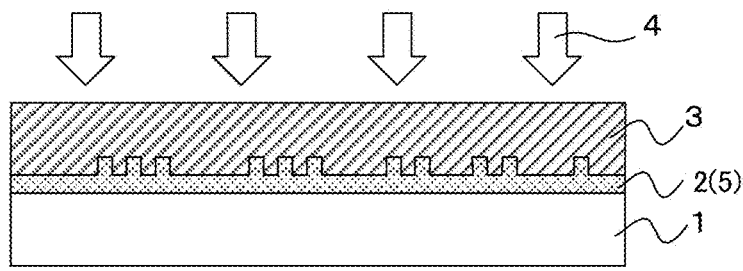
Figure 1D:
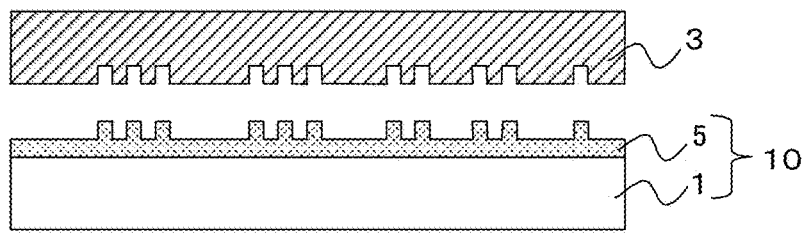

Then, as shown in FIGS. 1B and 1C, imprint mold 3 is brought into contact with the coating surface of resin composition 2 described above, and resin composition 2 is filled into the concavoconvex structure of imprint mold 3 (contacting step). Then, as shown in FIG. 1C, the resin composition is cured by irradiating light 4, under a condition that imprint mold 3 and substrate 1 are brought into contact with each other, to form a photocured resin for imprinting 5 (curing step). Then, as shown in FIG. 1D, imprint mold 3 is peeled off from the photocured resin for imprinting 5, to obtain pattern formed body 10 including a concavoconvex pattern made of the photocured resin for imprinting 5 (peeling step).

According to the present disclosure, by using the photocurable resin composition for imprinting having high stability over time and high antifouling effect to an imprint mold, a production at low cost is possible since the mold may be washed efficiently so that a high-definition pattern formed body may be produced.

Hereinafter, each step of the pattern formed body in the present disclosure will be described.

1. Coating Step

The coating step in the present disclosure is a step of coating one main surface of a substrate with the resin composition described above. Since the resin composition to be coated in this step is the same as the content described in the section of "A. Photocurable resin composition for imprinting" described above, description thereof will be omitted here.

The shape of the substrate in the present disclosure is not particularly limited, and may be, for example, a plate, a film, a sheet, or a rectangular parallelepiped.

The substrate is not particularly limited as long as it may support the coating layer of the resin composition, and the presence or absence of transparency, the presence or absence of smoothness, for example, are not particularly limited. Specific examples of the material of the substrate may include quartz, glass, silicon, sapphire, diamond, and a silicone material such as polydimethylsiloxane, a fluorine resin, a cycloolefin resin, and other resin material.

The shape of the substrate is not particularly limited, and may be, for example, a circular shape, and a rectangular shape. Also, although the thickness of the substrate varies depending on, for example, the material, and the application, it may be set in a range of, for example, 0.001 mm to 10 mm.

At least a part of such a substrate surface may be processed with a metal oxide, such as a metal oxide film is formed.

In the present disclosure, a method for coating the substrate with the resin composition is not particularly limited as long as it may be smoothly coated, and, for example, a general coating method such as a spin coating method, a spray method, a bar coating method, an inkjet method, a dip method, a roll coating method, a blade coating method, a doctor roll method, a doctor blade method, a curtain coating method, a slit coating method, and a screen printing method may be used. Among these, a spin coating method, a spray method, a bar coating method, and an inkjet method may be preferably used.

2. Contacting Step

The contact step in the present disclosure is a step of contacting a mold, including a concavoconvex structure on a surface thereof, with a resin composition-coated surface of the substrate.

The imprint mold is not particularly limited as long as it includes a concavoconvex pattern to be transferred, and a mold generally used in imprint lithography may be used. The material of the imprint mold in the present disclosure is not particularly limited as long as it is a material including a Si atom on a surface to be in contact with a resin. Examples thereof may include quartz, glass, silicon, and silicone resins. This is because, by using such an imprint mold, the advantage of the resin composition described above may be effectively obtained.

In this step, by bringing the imprint mold into contact with the resin composition, the resin composition is filled into the concavoconvex structure of the imprint mold.

3. Curing Step

The curing step in the present disclosure is a step of curing the photocurable resin composition for imprinting, so as to be a photocured resin for imprinting, by irradiating light under a condition that the mold and the substrate are brought into contact with each other.

The light irradiation is usually performed from the back side (the side wherein the pattern is not formed)) of the imprint mold. However, the light irradiation may be performed from the substrate side, for example, in the case where the substrate is transparent and the imprint mold is opaque.

The light to be irradiated is appropriately selected according to the sensitivity wavelength of the photocurable resin composition for imprinting. For example, ultraviolet rays of wavelength in a range of 150 nm to 400 nm, X-rays, and electron rays may be used, and ultraviolet rays are particularly preferably used. Examples of the light source for emitting ultraviolet rays may include a high-pressure mercury lamp, an ultra-high-pressure mercury lamp, a low-pressure mercury lamp, a Deep-UV lamp, a carbon arc lamp, a chemical lamp, a metal halide lamp, a xenon lamp, a KrF excimer laser, ArF excimer laser, and an F2 excimer laser, and an ultra-high-pressure mercury lamp is particularly preferable.

By this step, the resin composition becomes a photocured resin for imprinting with a concavoconvex pattern.

4. Peeling Step

The peeling step in the present disclosure is a step of peeling the mold from the photocured resin for imprinting on the surface of the substrate. The method for peeling is not particularly limited as long as the concavoconvex pattern of the photocured resin for imprinting formed is not broken, and a general method such as moving one of them for the purpose of peeling, may be used.

As described above, FIGS. 1A to 1D show a diagram wherein a flat plate is used as substrate 1 and a flat plate including a concavoconvex pattern is used as imprint mold 3 to obtain pattern formed body 10. However, a film-like substrate or a roll-like imprint mold may be preferably used. Specifically, examples of the combination of the substrate and the imprint mold may include the embodiments shown in FIGS. 3 to 5, in addition to FIGS. 1A to 1D.

Figure 3:
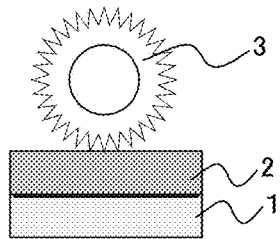
FIG. 3 is a schematic view for explaining an example of a combination of a substrate and an imprint mold used in the method for producing a pattern formed body in the present disclosure.

FIG. 3 is a diagram showing a case where a flat plate is used as substrate 1 and a roll mold including a concavoconvex pattern is used as imprint mold 3. In this embodiment, the resin composition is cured so as to be a photocured resin for imprinting, by irradiating light under a condition that the imprint mold and the substrate are brought into contact with each other, so that the resin composition is filled into the concavoconvex structure of the imprint mold, and imprint mold 3 is peeled off from the photocured resin for imprinting according to the rotation of the mold to obtain a pattern formed body.

Figure 4:
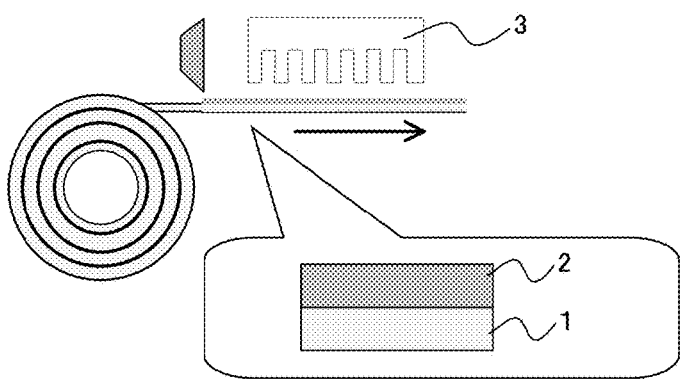
FIG. 4 is a schematic view for explaining another example of a combination of a substrate and an imprint mold used in the method for producing a pattern formed body in the present disclosure.

FIG. 4 is a diagram showing a case where a film-like substrate is used as substrate 1, and a flat plate including a concavoconvex pattern is used as imprint mold 3. In this aspect, substrate 1 of the film is taken out from the rolled state, taken out substrate 1 is coated with resin composition 2, and imprint mold 3 is brought into contact with the resin composition-coated surface. Thereafter, the resin composition is cured so as to be a photocured resin, by irradiating light under a condition that the imprint mold and the substrate are brought into contact with each other, and imprint mold 3 is peeled off from the photocured resin for imprinting to obtain a pattern formed body.

Figure 5:
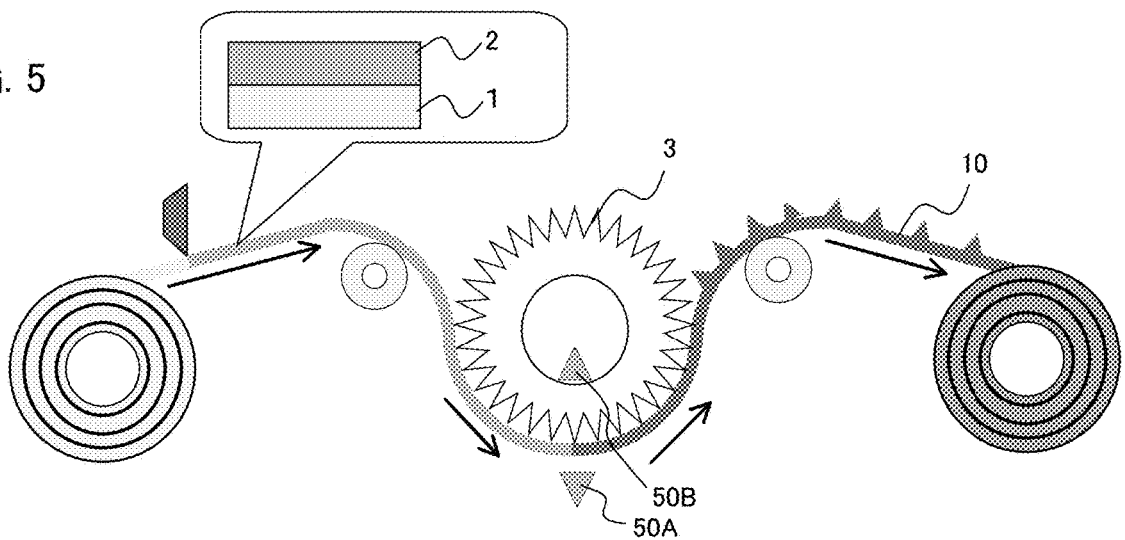
FIG. 5 is a schematic view for explaining another example of a combination of a substrate and an imprint mold used in the method for producing a pattern formed body in the present disclosure.

FIG. 5 is a diagram showing a case where a film-like substrate is used as substrate 1, and a roll mold including a concavoconvex pattern is used as imprint mold 3. In this aspect, substrate 1 of the film is taken out from the rolled state, taken out substrate 1 is coated with resin composition 2, and roll mold 3 including a concavoconvex pattern is brought into contact with the resin composition-coated surface. Then, the resin composition is cured so as to be a photocured resin for imprinting, by irradiating light from ultraviolet irradiation lamp 50 under a condition that mold 3 and substrate 1 are brought into contact with each other, and imprint mold 3 is peeled off from the photocured resin for imprinting according to the rotation of the mold to obtain pattern formed body 10 including a concavoconvex pattern including the photocured resin for imprinting. In this aspect, the installation position of ultraviolet irradiation lamp 50 is not particularly limited. For example, when roll mold 3 is transparent and substrate 1 is opaque, it may be installed in the mold (ultraviolet irradiation lamp 50B in FIG. 5), and when roll mold 3 is opaque and the substrate is transparent, it may be installed outside the mold (ultraviolet irradiation lamp 50A in FIG. 5).

5. Others

In addition to the aspects described above, the method for producing the pattern formed body in the present disclosure may be the aspects described below.

In other words, the method for producing a pattern formed body in the present aspect is characterized by comprising steps of: a coating step of coating a concavoconvex structure side surface of a mold including a concavoconvex structure on a surface thereof, with the photocurable resin composition for imprinting described above, a contacting step of contacting the substrate with the photocurable resin composition for imprinting-coated surface of the mold, a curing step of curing the photocurable resin composition for imprinting, so as to be a photocured resin for imprinting, by irradiating light under a condition that the mold and the substrate are brought into contact with each other, and a peeling step of peeling the mold from the photocured resin for imprinting on the substrate surface.

The method for producing the pattern formed body in the present aspect is different from the aspect described above in that the concavoconvex structure side surface of the mold is coated with the resin composition in the coating step.

Incidentally, since the aspect described above and the present aspect are the same except that the coating surface in the coating step is different, a description thereof will be omitted here.

D. Photocured Resin for Imprinting

The photocured resin for imprinting in the present disclosure is characterized by comprising a siloxane bond, wherein a ratio of oxygen atoms bonded to a single silicon atom, among oxygen atoms bonded to a silicon atom included in the photocured resin for imprinting, is 10 mol % or less. By patterning the substrate using a pattern formed of the photocured resin for imprinting in the present disclosure as a mask, the substrate may be patterned with high definition.

In the present disclosure, the ratio of oxygen atoms bonded to a single silicon atom (unreacted oxygen atom), among oxygen atoms bonded to a silicon atom included in the photocured resin for imprinting, is 10 mol % or less, and among them, it is preferably 7 mol % or less, particularly 5 mol % or less. Since the method for calculating the ratio of the unreacted oxygen atoms is the same as that described in the section of "A. Photocurable resin composition for imprinting" described above, a description thereof will be omitted here.

The photocured resin for imprinting is not particularly limited as long as it includes a siloxane bond wherein an oxygen atom is bonded to two silicon atoms, and the ratio of unreacted oxygen atom is in a predetermined range. For example, it may be obtained by curing the photocurable resin composition for imprinting described in the section of "A. Photocurable resin composition for imprinting" described above, and it is preferably a pattern formed body obtained by curing the photocurable resin composition for imprinting in a pattern. The method for producing the photocurable resin cured product for imprinting is not particularly limited, and may be produced by, for example, the method described in the section of "C. Method for producing pattern formed body" described above.

E. Method for Producing Imprint Mold

A method for producing an imprint mold in the present disclosure is characterized by comprising a step of etching the substrate using the pattern formed body obtained in the above "C. Method for producing pattern formed body", as a mask.

According to the present disclosure, by using the photocurable resin composition for imprinting having high stability over time and high antifouling effect to an imprint mold, efficient production is possible and a high-definition imprint mold may be produced. An imprint mold produced by such a method for producing an imprint mold is not particularly limited as long as it may be used as a transfer original plate in imprint lithography, and usually includes a transfer pattern of a concavoconvex shape on one main surface of a planar substrate.

Figure 2:
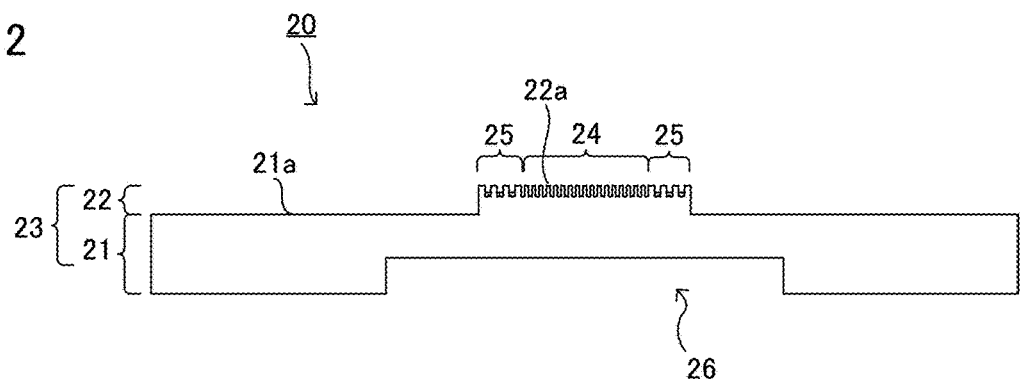
FIG. 2 is a schematic cross-sectional view illustrating an example of an imprint mold produced according to the method for producing an imprint mold in the present disclosure.

FIG. 2 is a schematic cross-sectional view showing an example of an imprint mold produced according to the method for producing an imprint mold in the present disclosure. As shown in FIG. 2, imprint mold 20 includes base 21 and mold substrate 23 including mesa structure 22 provided on main surface 21a of base 21, and a transfer pattern 24 including a concavoconvex structure is provided on main surface 22a of mesa structure 22. Also, alignment mark pattern 25 including a concavoconvex structure is provided on main surface 22a of mesa structure 22 in order to align imprint mold 20 with the transfer receptor. Further, recess 26 including mesa structure 22 in plan view is provided on a surface of base portion 21 opposite to main surface 21a.

The method for producing an imprint mold in the present disclosure is not particularly limited as long as the pattern formed body obtained in the above "C. Method for producing pattern formed body" is used as a mask, and may include, for example, each step described later.

1. Mold Substrate Preparing Step

The method for producing an imprint mold in the present disclosure may include a mold substrate preparing step of preparing a mold substrate for forming a transfer pattern. The mold substrate is not particularly limited as long as a transfer pattern may be formed thereon, and, for example, a plate-like substrate may be used. The mold substrate may include a mesa structure wherein a step difference is formed at a concavoconvex pattern-formed portion of the surface of the imprint mold to be in contact with a transfer receptor resin layer, if necessary. By including the mesa structure that limits the region to which the material to be transferred is applied, it is possible to limit the region where the resin layer to be transferred is wetted and spread. Also, the mold substrate may or may not be provided with a recess on a surface opposite to the transfer pattern. By providing such a recess, when the transfer pattern of the imprint mold is brought into close contact with the curable resin layer applied to the surface of the transfer receptor, the starting point at which the transfer pattern first comes into contact with the curable resin layer may be limited by increasing the air pressure in the recess to bend the imprint mold. Also, by curving the recess, when the imprint mold is peeled off, it is possible to limit the portion where peeling starts, and it is possible to suppress defects at the time of peeling, by peeling off slowly and smoothly from the end of the mesa.

The mold substrate is not particularly limited as long as it is capable of forming a concavoconvex pattern, and may transmit or block the irradiated light. When the mold substrate transmits the irradiated light, light may be irradiated from the mold substrate side. Meanwhile, when the mold substrate blocks the irradiated light, if the transfer receptor substrate transmits the irradiated light, the light may be irradiated from the side of the transfer receptor substrate.

Examples of materials of such a mold substrate may include a semiconductor such as silicon (Si), gallium nitride (GaN) and gallium arsenide (GaAs); glass such as quartz and soda lime glass; metals such as nickel (Ni) and aluminum (Al); ceramics such as silicon nitride (SiN), silicon oxide ($SiO_2$) and silicon carbide (SiC); diamond; diamond-like carbon (DLC); and cubic boron nitride (CBN). Among them, quartz, glass, and silicon (Si) are preferable from the viewpoint that processing of finer dimensions is possible.

The light transmittance of the light in a wavelength range of 300 nm to 450 nm, of such mold substrate is preferably, for example 85% or more. Also, at least a part of the surface of the mold substrate may be treated with a metal oxide, for example, a metal oxide film may be formed.

2. Transfer Pattern Forming Step

The method for producing an imprint mold in the present disclosure may include a transfer pattern forming step of forming a transfer pattern by forming a pattern of a photocured resin for imprinting, obtained by curing a photocurable resin composition for imprinting, on the mold substrate, and etching the substrate using the pattern of the photocured resin for imprinting, as a mask.

The formation of the pattern of the photocured resin for imprinting obtained by curing the resin composition has been described in the above "C. Method for producing pattern formed body", and therefore, description thereof will be omitted here.

The method for etching the mold substrate on which the pattern of a photocured resin for imprinting is formed is not particularly limited, and may be etched by a conventionally known method, for example, dry etching. Gas used in dry etching may be appropriately selected according to the elemental composition of the mold substrate. For example, oxygen atom containing gas such as oxygen, carbon monoxide, and carbon dioxide; inert gas such as helium, nitrogen, and argon; chlorine-based gas such as chlorine, and boron trichloride; fluorine gas; fluorocarbon-based gas; hydrogen gas; and ammonia gas may be used. These gases may be used alone, or as an appropriate mixture.

The transfer pattern formed in this step is a pattern including a concavoconvex structure when the mold substrate is viewed in cross-section, and is a pattern to be transferred to a transfer receptor. The shape of the transfer pattern is not particularly limited. Examples thereof may include a concavoconvex structure pattern such as lines and spaces, dots, holes, isolated spaces, isolated lines, pillars, lenses, and step differences.

F. Method for Producing Device

A method for producing a device in the present disclosure is characterized by comprising a step of etching the substrate using the pattern formed body obtained in the above "C. Method for producing pattern formed body", as a mask. According to the present disclosure, it is possible to produce a high-definition device with good producing efficiency.

Such method for producing a device is not particularly limited as long as the pattern formed body obtained in the above "C. Method for producing pattern formed body" is used as a mask.

Since the method for producing the device in the present disclosure is the same as the method for producing the imprint mold described above except that various substrates are used depending on the device to be obtained, a description thereof will be omitted here.

The device produced in the present disclosure are not particularly limited as long as it requires formation of fine patterns in the production process. Examples thereof may include semiconductor devices, optical elements (such as diffraction gratings, and polarizing elements), wiring circuitry, data storage media (such as hard disks, and optical media), medical members (such as analytical inspection chips, and microneedles), biodevices (such as biosensors, and cell culture substrates), precision inspection equipment members (such as inspection probes, and sample holding members), display panels, panel members, energy devices (such as solar cells, and fuel cells), micro flow paths, microreactors, MEMS devices, imprint molds, and photomasks.

Incidentally, the present disclosure is not limited to the embodiments. The embodiments are exemplification, and any other variations are intended to be included in the technical scope of the present disclosure if they have substantially the same constitution as the technical idea described in the claim of the present disclosure and offer similar operation and effect thereto.

EXAMPLES

The present disclosure is hereinafter explained in further details with reference to Examples and Comparative Examples.

Synthesis Example 1

To 75.1 g of 2-propanol, 20.5 g of 3-acryloxypropyltrimethoxysilane and 19.5 g of dimethoxydimethylsilane were dissolved. To this, a mixed solution of 9 g of ion-exchanged water and 1.5 g of HCl of 1 M was added dropwise, and the mixture was stirred at room temperature for 4 hours. The volatile components of the obtained reaction solution were removed to obtain polymerizable compound 1 (highly reactive polymerizable compound).

[Chemical 8]

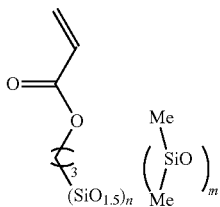

Synthesis Example 2

Polymerizable compound 2 (highly reactive polymerizable compound) was obtained via the same process as in Synthesis Example 1, except that 58.6 g of 3-acryloxypropyltrimethoxysilane was used instead of 20.5 g of 3-acryloxypropyltrimethoxysilane and 19.5 g of dimethoxydimethylsilane, and 12 g of ion-exchanged water was used instead of 9 g of ion-exchanged water.

[Chemical 9]

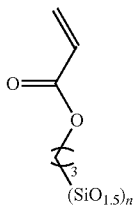

Example 1

To polymerizable compound 1, chlorotrimethylsilane was used as a protective agent to protect the highly reactive functional group included in the polymerizable compound. Treatment with the chlorotrimethylsilane was carried out as follows.

To 20 ml of tetrahydrofuran, 5 g of polymerizable compound 1 was dissolved, 5.34 g of chlorotrimethylsilane was added thereto, and refluxed for 1 hour. After addition of 1.7 g of methanol and stirring for 10 minutes, the volatile components were removed to obtain polymerizable compound 3.

[Chemical 10]

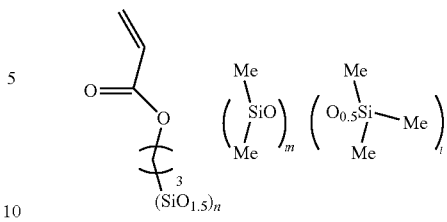

To 1 g of polymerizable compound 3, 0.01 g of Irgacure 907 was dissolved as a photopolymerization initiator to obtain a photocurable resin composition.

With respect to the photocurable resin composition for imprinting thus obtained, the ratio of oxygen atoms bonded to a single silicon atom was calculated by the method described in the section "A. Photocurable resin composition for imprinting" described above. The results are shown in Table 1.

Example 2

A photocurable resin composition for imprinting was obtained in the same manner as in Example 1, except that the mixture was stirred at room temperature for 30 minutes after the addition of chlorotrimethylsilane, and the ratio of unreacted oxygen atoms was calculated by the same method as in Example 1. The results are shown in Table 1.

Example 3

A photocurable resin composition for imprinting was obtained in the same manner as in Example 2, except that polymerizable compound 2 was used instead of polymerizable compound 1 described above, and 3.79 g of chlorotrimethylsilane was used instead of 5.34 g of chlorotrimethylsilane, and polymerizable compound 4 shown below was obtained. The ratio of unreacted oxygen atoms was calculated by the same method as in Example 1. The results are shown in Table 1.

[Chemical 11]

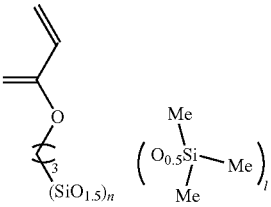

Comparative Example 1

A photocurable resin composition for imprinting was obtained in the same manner as in Example 1, except that polymerizable compound 2 described above was not subjected to the treatment with chlorotrimethylsilane, and was used as a polymerizable compound in Comparative Example 1 as it was. The ratio of unreacted oxygen atoms was calculated by the same method as in Example 1. The results are shown in Table 1.

Comparative Example 2

A photocurable resin composition for imprinting was obtained in the same manner as in Comparative Example 1, except that polymerizable compound 1 was used instead of polymerizable compound 2. The ratio of unreacted oxygen atoms was calculated by the same method as in Example 1. The results are shown in Table 1.

[Antifouling Property Evaluation]

The photocurable resin compositions for imprinting produced in Examples 1 to 3 and Comparative Examples 1 to 2 were used to evaluate the antifouling property. Specifically, a quartz substrate was coated with the photocurable resin composition for imprinting, and the photocurable resin composition for imprinting was cured by light irradiation under a condition of 20 mWcm-2, 250 sec under a condition being in contacted with a quartz imprint mold, and the imprint mold was peeled off to form a pattern on the substrate. After repeating such a pattern forming process for five times, the light transmittance of the imprint mold after use was measured. As the light transmittance, the transmittance in the wavelength of 220 nm to 400 nm was measured using an ultraviolet-visible spectrophotometer UV-2700 from Shimadzu Corporation.

The antifouling property was evaluated by the variation, that is, by comparing the light transmittance of the imprint mold after use, with the light transmittance before use. The light transmittance of the imprint mold before use was 93%.

The antifouling property was evaluated according to the following evaluation criteria. The results are shown in Table 1.

⊚: Light transmittance variation was less than 1%
○: Light transmittance variation was 1% or more and 3% or less.
Δ: Light transmittance variation was 3% or more and 5% or less.
X: Light transmittance variation was over 5%

[Evaluation of Stability Over Time]

The photocurable resin compositions for imprinting produced in Examples 1 to 3 and Comparative Examples 1 to 2 were used to evaluate the stability over time. Specifically, the viscosity of each photocurable resin composition for imprinting was measured after production (before storage), and thereafter, after storage at 25° C., 40% RH, and in the dark for 30 days, the viscosity was measured by the same measurement method as before storage, and the variation in viscosity before and after storage was examined. The measurement of viscosity was carried out using the following device under the following conditions:

Measuring equipment: E-type viscometer, MCR301 type from Anton Paar GmbH
Cone Model: CP25-2
Cone diameter: 25 mm
Cone angle: 2°
Measurement temperature: 25° C.
Shear speed range: 0.9999-1000 [1/s]
Number of measurement points: 33 points at logarithmic intervals in the above shear rate range The stability over time was evaluated by the following evaluation criteria. The results are shown in Table 1.

⊚: Viscosity variation before and after storage was less than 2%
○: Viscosity variation before and after storage was 2% or more and 5% or less
Δ: Viscosity variation before and after storage was 5% or more and not 10% or less X: Viscosity variation before and after storage was over 10%

TABLE 1

| Sample | Ratio of unreacted oxygen atoms | Antifouling effect | Stability over time |
|---|---|---|---|
| Example 1 | 2 mol % | ⊚ | ⊚ |
| Example 2 | 3 mol % | ⊚ | ⊚ |
| Example 3 | 7 mol % | ○ | ○ |
| Comp. Ex. 1 | 11 mol % | Δ | Δ |
| Comp. Ex. 2 | 13 mol % | X | X |

[Summary]

As shown in Table 1, the photocurable resin compositions for imprinting in Examples 1 to 3 had good results in antifouling property and stability over time. Meanwhile, for the photocurable resin composition for imprinting in Comparative Example 1 wherein the ratio of unreacted oxygen atoms was higher than that in Example 3, there was a slight variation in light transmittance and a slight variation in viscosity. Further, for the photocurable resin composition for imprinting in Comparative Example 2 wherein the ratio of unreacted oxygen atoms was higher than that in Comparative Example 1, the amount of variation was large both in light transmittance and viscosity.

Synthesis Example 3

To 75.1 g of 2-propanol, 20.5 g of 3-acryloxypropyl trimethoxysilane and 40.3 g of 3-methacryloxypropyl (methyl) dimethoxysilane were dissolved.

To this, a mixed solution of 9.8 g of ion-exchanged water and 1.3 g of a 37% aqueous HCl solution was added dropwise, and the mixture was stirred at room temperature for 4 hours. The volatile components of the obtained reaction solution were removed to obtain a polymerizable compound 5.

Synthesis Example 4

To 75.1 g of 2-propanol, 10.0 g of 3-acryloxypropyl trimethoxysilane and 54.0 g of 3-methacryloxypropyl (methyl) dimethoxysilane were dissolved.

To this, a mixed solution of 9.8 g of ion-exchanged water and 1.3 g of a 37% aqueous HCl solution was added dropwise, and the mixture was stirred at room temperature for 4 hours. The volatile components of the obtained reaction solution were moved to obtain a polymerizable compound 6.

Synthesis Example 5

To 75.1 g of 2-propanol, 65.1 g of 3-methacryloxypropyl (methyl) dimethoxysilane was dissolved. To this, a mixed solution of 9.8 g of ion-exchanged water and 1.3 g of a 37% aqueous HCl solution was added dropwise, and the mixture was stirred at room temperature for 4 hours. The volatile components of the obtained reaction solution were removed to obtain a polymerizable compound 7.

Example 4

To 1 g of polymerizable compound 5, 0.01 g of Irgacure 907 was dissolved as a photopolymerization initiator to obtain a photocurable resin composition.

With respect to the photocurable resin composition for imprinting thus obtained, the ratio of oxygen atoms bonded to a single silicon atom was calculated by the method described in the section "A. Photocurable resin composition for imprinting" described above. The antifouling evaluation and the stability over time evaluation were carried out in the same manner as in Examples 1 to 3. The results are shown in Table 2.

Example 5

To 1 g of the polymerizable compound 6, 0.01 g of Irgacure 907 was dissolved as a photopolymerization initiator to obtain a photocurable resin composition.

With respect to the photocurable resin composition for imprinting thus obtained, the ratio of oxygen atoms bonded to a single silicon atom was calculated by the method described in the section "A. Photocurable resin composition for imprinting" described above. The antifouling evaluation and the stability over time evaluation were carried out in the same manner as in Examples 1 to 3. The results are shown in Table 2.

Example 6

To 1 g of the polymerizable compound 7, 0.01 g of Irgacure 907 was dissolved as a photopolymerization initiator to obtain a photocurable resin composition.

With respect to the photocurable resin composition for imprinting thus obtained, the ratio of oxygen atoms bonded to a single silicon atom was calculated by the method described in the section "A. Photocurable resin composition for imprinting" described above. The antifouling evaluation and the stability over time evaluation were carried out in the same manner as in Examples 1 to 3. The results are shown in Table 2.

Synthesis Example 6

To 93.9 g of acetone, 12.4 g of 3-methacryloxypropyltrimethoxysilane was dissolved, and warmed to 50° C. A mixed solution of 13.5 g of ion-exchanged water and 0.07 g of potassium carbonate ($K_2CO_3$) was added dropwise thereto, and the mixture was stirred at 50° C. for 5 hours. The resulting reaction solution was washed with saturated saline and chloroform to extract. The volatile components were removed to obtain a polymerizable compound 8 including a spherical structure.

Synthesis Example 7

A polymerizable compound 9 including a spherical structure was obtained by the same operation as in Synthesis Example 6, except that 11.7 g of 3-acryloxypropyltrimethoxysilane was used instead of 3-methacryloxypropyltrimethoxysilane.

Example 7

To 1 g of the polymerizable compound 8, 0.01 g of Irgacure 907 was dissolved as a photopolymerization initiator to obtain a photocurable resin composition.

With respect to the photocurable resin composition for imprinting thus obtained, the ratio of oxygen atoms bonded to a single silicon atom was calculated by the method described in the section "A. Photocurable resin composition for imprinting" described above. The antifouling evaluation and the stability over time evaluation were carried out in the same manner as in Examples 1 to 3. The results are shown in Table 3.

Example 8

To 1 g of the polymerizable compound 9, 0.01 g of Irgacure 907 was dissolved as a photopolymerization initiator to obtain a photocurable resin composition.

TABLE 2

| Sample | Structure of raw material silane and molar ratio | | Ratio of unreacted oxygen atoms | Antifouling effect | Stability over time |
|---|---|---|---|---|---|
| | 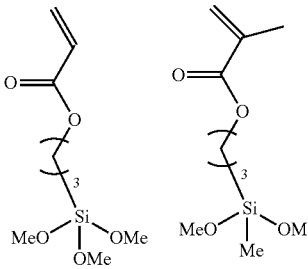 | 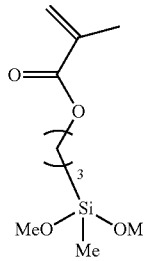 | | | |
| Example 4 | 35 | 65 | 9 mol % | ○ | ○ |
| Example 5 | 17 | 83 | 5 mol % | ◎ | ◎ |
| Example 7 | 0 | 100 | 2 mol % | ◎ | ◎ |

As shown in Table 2, by using a methacrylic group containing bifunctional silane more than a trifunctional silane, as a raw material, it was possible to reduce the ratio of unreacted oxygen atoms even without carrying out a stabilization treatment. In particular, when only the methacrylic group containing bifunctional silane was used, the ratio of unreacted oxygen atoms was 2 mol % or less. The photocurable resin compositions for imprinting in Examples 4 to 6 had good results in antifouling property and stability over time.

With respect to the photocurable resin composition for imprinting thus obtained, the ratio of oxygen atoms bonded to a single silicon atom was calculated by the method described in the section "A. Photocurable resin composition for imprinting" described above. The antifouling evaluation and the stability over time evaluation were carried out in the same manner as in Examples 1 to 3. The results are shown in Table 3.

TABLE 3

| Sample | Synthetic method | Ratio of unreacted oxygen atoms | Anti-Fouling effect | Stability over time |
|---|---|---|---|---|
| Example 7 | 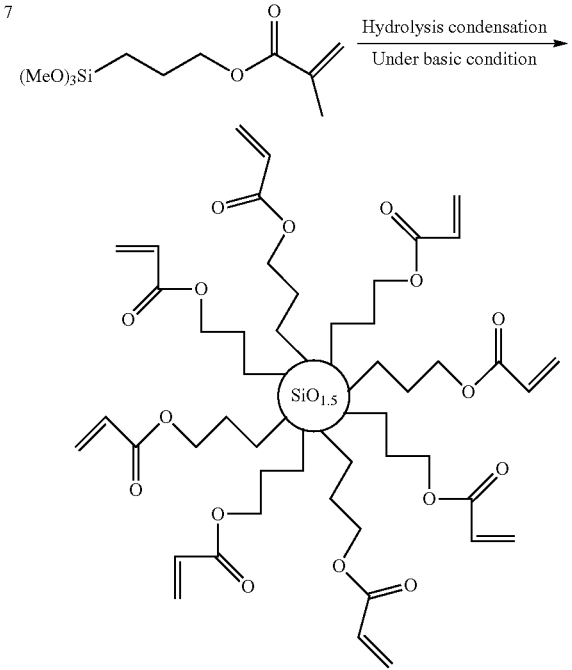 | 3 mol % | ◎ | ◎ |
| Example 8 | 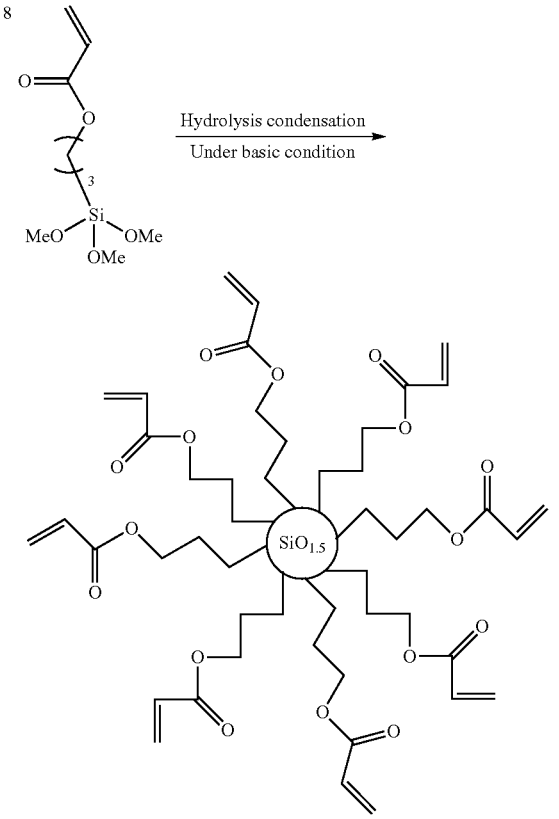 | 2 mol % | ◎ | ◎ |

As shown in Table 3, by subjecting a silane composition including a trifunctional silane to hydrolytic condensation under basic conditions, a siloxane having a high degree of condensation including a spherical structure was obtained, and it was possible to reduce the ratio of unreacted oxygen atoms. The results of the photocurable resin compositions for imprinting in Examples 7 to 8 were good in antifouling property and stability over time.

Example 9

To 30 g of 1,2-epoxy-4-vinylcyclohexane, 3.2 g of POSS (polyhedral oligomer silsesquioxane) including 8 Si—H groups was dissolved, and 60 µl of a Karstedt catalyst xylene solution of 0.1 M was added. After heating at 80° C. for 2 hours, the volatile components were removed under reduced pressure to obtain the polymerizable compound 10 shown in Table 4.

To 1 g of the polymerizable compound 10, 0.1 g of CPI-210S was dissolved as a photopolymerization initiator to obtain a photocurable resin composition.

With respect to the photocurable resin composition for imprinting thus obtained, the ratio of oxygen atoms bonded to a single silicon atom was calculated by the method described in the section "A. Photocurable resin composition for imprinting" described above. The antifouling evaluation and the stability over time evaluation were carried out in the same manner as in Examples 1 to 3. The results are shown in Table 4.

Example 10

To 22.4 g of THF, 3.2 g of 1,3,5,7,9,11,14-heptaisobutyl-tricyclo[7.3.3.1$^{5,11}$]heptasiloxane-endo-3,7,14-triol and 4.1 g of tetraethylamine were dissolved, and 4.0 g of 3-(chlorodimethylsilyl)propyl methacrylate was added. The solution was stirred at room temperature for 4 hours, and after filtration, the volatile components were removed to obtain the polymerizable compound 11 shown in Table 4. From the results of $^{29}$Si NMR measurements, it was found that 2.2 polymerizable groups were introduced into the polymerizable compound 11, and the unreacted oxygen atom was 3%. To 1 g of the polymerizable compound 11, 0.01 g of Irgacure 907 was dissolved as a photopolymerization initiator to obtain a photocurable resin composition. As in Example 9, the ratio of oxygen atoms bonded to a single silicon atom was calculated. The antifouling evaluation and the stability over time evaluation were carried out in the same manner as in Examples 1 to 3. The results are shown in Table 4.

Example 11

To 22.4 g of THF, 3.6 g of 1,3,5,7,9,11-octaisobutyltetracyclo[7.3.3.1$^{5,11}$]octasiloxane endo-3,7-diol and 2.7 g of tetraethylamine were dissolved, and 2.6 g of 3-(chlorodimethylsilyl) propyl methacrylate was added. The solution was stirred at room temperature for 4 hours, and after filtration, the volatile components were removed to obtain the polymerizable compound 12 shown in Table 4. From the results of $^{29}$Si NMR measurements, it was found that 1.2 polymerizable groups were introduced into the polymerizable compound 12, and the unreacted oxygen atom was 3%. To 1 g of the polymerizable compound 12, 0.01 g of Irgacure 907 was dissolved as a photopolymerization initiator to obtain a photocurable resin composition. As in Example 9, the ratio of oxygen atoms bonded to a single silicon atom was calculated. The antifouling evaluation and the stability over time evaluation were carried out in the same manner as in Examples 1 to 3. The results are shown in Table 4.

Example 12

To 30 g of THF, 2.3 g of a double 4 membered ring silicate octamer-tetramethylammonium salt hydrate and 6.1 g of tetraethylamine were dissolved, and 13.4 g of 3-(chlorodimethylsilyl)propyl methacrylate was added. The solution was stirred at room temperature for 4 hours, and after filtration, the volatile components were removed and purified to obtain the polymerizable compound 13 shown in Table 4. From the results of $^{29}$Si NMR measurements, it was found that 8 polymerizable groups were introduced into the polymerizable compound 13, and the unreacted oxygen atoms was 0%. To 1 g of the polymerizable compound 13, 0.01 g of Irgacure 907 was dissolved as a photopolymerization initiator to obtain a photocurable resin composition. As in Example 9, the ratio of oxygen atoms bonded to a single silicon atom was calculated. The antifouling evaluation and the stability over time evaluation were carried out in the same manner as in Examples 1 to 3. The results are shown in Table 4.

TABLE 4

| | Polymerizable compound | Siloxane structure | Ratio of unreacted oxygen atoms | Anti-Fouling effect | Stability over time |
| --- | --- | --- | --- | --- | --- |
| Ex. 9 | Polymerizable compound 10 | (cage POSS structure with 8 Si, R groups; R = vinylcyclohexane epoxide) | 0 mol % | ⊚ | ⊚ |

TABLE 4-continued

| | Polymerizable compound | Siloxane structure | Ratio of unreacted oxygen atoms | Anti-Fouling effect | Stability over time |
|---|---|---|---|---|---|
| Ex. 10 | Polymerizable compound 11 | [structure with R = Bu; $R_2$ = -Si(Me)(Me)-(CH$_2$)$_3$-O-C(=O)-C(Me)=CH$_2$ or H] | 3 mol % | ◎ | ◎ |
| Ex. 11 | Polymerizable compound 12 | [structure with R = Bu; $R_2$ = -Si(Me)(Me)-(CH$_2$)$_3$-O-C(=O)-C(Me)=CH$_2$ or H] | 3 mol % | ◎ | ◎ |
| Ex. 12 | Polymerizable compound 13 | [structure with $R^{16}$ = -Si(Me)(Me)-(CH$_2$)$_3$-O-C(=O)-C(Me)=CH$_2$] | 0 mol % | ◎ | ◎ |

As shown in Table 4, by using a polyhedral siloxane oligomer, including a completely or incompletely condensed skeleton to which the polymerizable functional group is bonded, as a polymerizable compound, it was possible to reduce the ratio of unreacted oxygen atoms. The results of the photocurable resin compositions for imprinting in Examples 9 to 11 were good in antifouling property and stability over time.

REFERENCE SIGNS LIST

2 . . . photocured resin for imprinting
3, 20 . . . imprint mold
10 . . . pattern formed body

The invention claimed is:

1. A photocurable resin composition for imprinting comprising a polymerizable compound, and a photopolymerization initiator,
   wherein the polymerizable compound includes a siloxane bond in a molecule, and includes at least one polymerizable functional group,
   a ratio of oxygen atoms bonded to a single silicon atom, among oxygen atoms bonded to a silicon atom included in the polymerizable compound, is 10 mol % or less, and
   the polymerizable compound includes a spherical structure.

2. The photocurable resin composition for imprinting according to claim 1, wherein the polymerizable functional group is at least one selected from a group consisting of an acryloyl group, a methacryloyl group, an epoxy group, and an oxetane group.

3. A photocurable resin composition for imprinting comprising a polymerizable compound, and a photopolymerization initiator,
wherein the polymerizable compound includes a siloxane bond in a molecule, and includes at least one polymerizable functional group,
a ratio of oxygen atoms bonded to a single silicon atom, among oxygen atoms bonded to a silicon atom included in the polymerizable compound, is 10 mol % or less,
the photocurable resin composition for imprinting further comprising a fluorine-based surfactant or a silicone-based surfactant, and
the content of the fluorine-based surfactant or the silicone-based surfactant is 10 mass % or less, with respect to a total solid content of the photocurable resin composition for imprinting.

4. A photocurable resin composition for imprinting comprising a polymerizable compound, and a photopolymerization initiator,
wherein the polymerizable compound includes a siloxane bond in a molecule, and includes at least one polymerizable functional group,
a ratio of oxygen atoms bonded to a single silicon atom, among oxygen atoms bonded to a silicon atom included in the polymerizable compound, is 10 mol % or less,
the polymerizable compound includes a bifunctional silane as a constituent unit, more than a trifunctional silane.

5. A method for producing a pattern formed body, the method comprising steps of:
a coating step of coating one main surface of a substrate with the photocurable resin composition for imprinting according to claim 1,
a contacting step of contacting a surface of the substrate, coated with the photocurable resin composition for imprinting, with a mold including a concavoconvex structure on a surface,
a curing step of curing the photocurable resin composition for imprinting, so as to be a photocured resin for imprinting, by irradiating light under a condition that the mold and the substrate are brought into contact with each other, and
a peeling step of peeling the mold from the photocured resin for imprinting on the substrate surface.

6. A method for producing a pattern formed body, the method comprising steps of:
a coating step of coating a concavoconvex structure side surface of a mold including a concavoconvex structure on a surface thereof, with the photocurable resin composition for imprinting according to claim 1,
a contacting step of contacting the substrate with a surface of the mold, coated with the photocurable resin composition for imprinting,
a curing step of curing the photocurable resin composition for imprinting, so as to be a photocured resin for imprinting, by irradiating light under a condition that the mold and the substrate are brought into contact with each other, and
a peeling step of peeling the mold from the photocured resin for imprinting on the substrate surface.

7. A photocured resin for imprinting comprising a siloxane bond,
wherein a ratio of oxygen atoms bonded to a single silicon atom, among oxygen atoms bonded to a silicon atom included in the photocured resin for imprinting, is 10 mol % or less, and
the polymerizable compound includes a spherical structure.

8. A method for producing an imprint mold, the method comprising a step of etching the substrate using the pattern formed body obtained according to claim 5, as a mask.

9. A method for producing a device, the method comprising a step of etching the substrate using the pattern formed body obtained according to claim 5, as a mask.

10. The photocurable resin composition for imprinting according to claim 3, wherein the polymerizable compound is a polyhedral siloxane oligomer including a completely or incompletely condensed skeleton to which the polymerizable functional group is bonded.

11. The photocurable resin composition for imprinting according to claim 4, wherein the polymerizable compound is a polyhedral siloxane oligomer including a completely or incompletely condensed skeleton to which the polymerizable functional group is bonded.

* * * * *